United States Patent [19]

Shao et al.

[11] Patent Number: 4,868,828
[45] Date of Patent: Sep. 19, 1989

[54] ARCHITECTURE FOR TIME OR TRANSFORM DOMAIN DECODING OF REED-SOLOMON CODES

[75] Inventors: Howard M. Shao, Woodland Hills; Trieu-Kie Truong; In-Shek Hsu, both of Pasadena; Leslie J. Deutsch, Sepulveda, all of Calif.

[73] Assignee: California Institute of Technology, Pasadena, Calif.

[21] Appl. No.: 105,101

[22] Filed: Oct. 5, 1987

[51] Int. Cl.⁴ ............................................. G06F 11/10
[52] U.S. Cl. ................................... 371/5.1; 371/37.5; 371/39.1
[58] Field of Search ...................... 371/37, 38, 39, 40

[56] References Cited

U.S. PATENT DOCUMENTS

| | | | |
|---|---|---|---|
| 4,162,480 | 7/1979 | Berlekamp | 371/37 |
| 4,649,541 | 3/1987 | Lahmeyer | 371/37 |
| 4,665,523 | 5/1987 | Citron et al. | 371/37 |
| 4,777,635 | 10/1988 | Glover | 371/40 |

Primary Examiner—Charles E. Atkinson
Attorney, Agent, or Firm—Freilich, Hornbaker, Rosen & Fernandez

[57] ABSTRACT

Two pipeline (255,233) RS decoders, one a time domain decoder and the other a transform domain decoder, use the same first part to develop an errata locator polynomial $\tau(x)$, and an errata evaluator polynominal $A(x)$. Both the time domain decoder and transform domain decoder have a modified GCD that uses an input multiplexer and an output demultiplexer to reduce the number of GCD cells required. The time domain decoder uses a Chien search and polynomial evaluator on the GCD outputs $\tau(x)$ and $A(x)$, for the final decoding steps, while the transform domain decoder uses a transform error pattern algorithm operating on $\tau(x)$ and the initial syndrome computation $S(x)$, followed by an inverse transform algorithm in sequence for the final decoding steps prior to adding the received RS coded message to produce a decoded output message.

7 Claims, 13 Drawing Sheets

FIG. 2

Table 1

An Example of the Euclidean Algorithm Used to Find $\tau(x)$ and $A(x)$ $$R_{s-2}(x) = q_{s-1}(x)R_{s-1}(x) + R_s(x)$$

| s | $R_{s-2}(x) = q_{s-1}(x)R_{s-1}(x) + R_s(x)$ | $q_{s-1}(x)$ | $R_s(x)$ | $\tau_s(x)$ |
|---|---|---|---|---|
| -1 | | | $x^6$ | 0 |
| 0 | $\alpha^8 x^5 + \alpha^9 x^4 + \alpha^3 x^3 + \alpha^{12} x^2 + \alpha^5 x + 1$ | | $\alpha^8 x^5 + \alpha^9 x^4 + \alpha^3 x^3 + \alpha^{12} x^2 + \alpha^5 x + 1$ | $1 + \alpha^7 x$ |
| 1 | $\dfrac{1}{\alpha^8}x + \dfrac{\alpha^8}{\alpha}$<br>$\alpha^8 x^5 + \alpha^9 x^4 + \alpha^3 x^3 + \alpha^{12} x^2 + \alpha^5 x + 1 \Big) x^6$<br>$\dfrac{x^6 + \alpha x^5 + \alpha^8 x^4 + \alpha^4 x^3 + \alpha^{12} x^2 + \alpha^2 x + \alpha^7 x}{\alpha x^5 + \alpha^8 x^4 + \alpha^4 x^3 + \alpha^{12} x^2 + \alpha^2 x + \alpha^7 x}$<br>$\dfrac{\alpha x^5 + \alpha^2 x^4 + \alpha^9 x^3 + \alpha^5 x^2 + \alpha^{13} x + \alpha^8}{\alpha^4 x^4 + \alpha^{14} x^3 + \alpha^3 x^2 + \alpha x + \alpha^8}$ | $\dfrac{1}{\alpha^8}(x+\alpha)$ | $\alpha^4 x^4 + \alpha^{14} x^3 + \alpha^6 x^2 + \alpha^2 x + \alpha^8$ | $\dfrac{1}{\alpha^8}(x+\alpha)(1+\alpha^7 x)$<br>$+ 0 = \dfrac{1}{\alpha^8}(\alpha^7 x^2 + \alpha^2 x + 2)$ |
| 2 | $\alpha^8 x + 1$<br>$\alpha^4 x^4 + \alpha^{14} x^3 + \alpha^2 x^2 + \alpha^5 x + \alpha^8 \Big) \alpha^8 x^5 + \alpha^9 x^4 + \alpha^3 x^3 + \alpha^{12} x^2 + \alpha^5 x + 1$<br>$\dfrac{\alpha^8 x^5 + \alpha^5 x^4 + \alpha^7 x^3 + \alpha^3 x^2 + \alpha x}{x^4 + \alpha^{14} x^3 + \alpha x^2 + \alpha^2 x + 1}$<br>$\dfrac{x^4 + \alpha^{14} x^3 + \alpha^2 x^2 + \alpha^5 x + \alpha^8}{\alpha^7 x^2 + \alpha x + \alpha^2}$ | $\alpha^8 x + 1$ | $\alpha^7 x^2 + \alpha x + \alpha^2$ | $(\alpha^7 x^2 + \alpha^2 x + \alpha) \cdot (x + \alpha^7)$<br>$+ (1 + \alpha^7 x)$<br>$= \alpha^7 x^3 + \alpha^{13} x^2 + \alpha^4 x + \alpha$ |

FIG. II

ARCHITECTURE FOR TIME OR TRANSFORM DOMAIN DECODING OF REED-SOLOMON CODES

ORIGIN OF INVENTION

The invention described herein was made in the performance of work under a NASA contract, and is subject to the provisions of Public Law 95-517 (35 USC 202) in which the Contractor has elected to retain title.

BACKGROUND OF THE INVENTION

This invention relates to a method and apparatus for finding the error locator polynomial required for decoding a Reed-Solomon (RS) code, and more particularly to an efficient, VLSI implementable, time or transform domain RS decoder.

By this invention, both the errata locator and errata evaluator polynomials can be obtained simultaneously and simply by the Euclidean algorithm. With these ideas, the complexity of both the time and transform domain Reed-Solomon decoders for correcting errors and erasures can be simplified. As a consequence, decoders for correcting errors and erasures of Reed-Solomon codes can be made more modular, regular, simple, and naturally suitable for VLSI implementation.

The Euclidean algorithm for solving the key equation for decoding BCH and Goppa type codes was disclosed by Sugiyama, et al., in Y. Sugiyama, M. Kasahara, S. Hirasawa and T. Namekawa, "A method for solving key equation for decoding Goppa codes," *IEEE Trans. on Contr.*, vol. 27, 1975, pp. 87–99. A fast decoding of RS codes using continued fraction which is closely related to the Euclidean algorithm was disclosed by I. S. Reed, R. A. Scholtz, T. K. Truong and L. R. Welch, "The fast decoding of Reed-Solomon codes using Fermat theoretic transforms and continued fractions," *IEEE Trans. on Information Theory*, vol. IT-24, no. 1, January 1978., and L. R. Welch and R. A. Scholtz, "Continued fractions and Berlekamp's algorithm," *IEEE Trans. on Information Theory*, vol. IT-25, 1979, pp. 19–27. Brent and Kung in "Systolic VLSI arrays for polynomial GCD computation," *IEEE Trans. on Computers*, vol. C-33, no. 8, August 1984, pp. 731–736, were the first to suggest a systolic array architecture for computing the greatest common divisor (GCD) of two polynomials. By the use of the above ideas, a pipeline structure for a transform domain decoder was developed to decode errors of RS codes. See H. M. Shao, T. K. Truong, L. J. Deutsch, J. H. Yuen and I. S. Reed, "A VLSI design of a pipeline Reed-Solomon decoder," *IEEE Trans. on Computers*, vol. C-34, no. 5, May 1985. An important ingredient of this design was a modified Euclidean algorithm for computing the error-locator polynomial.

The computation of inverse field elements is completely avoided in the above-mentioned modification of Euclid's algorithm. Recently, it was proposed that a recursive algorithm could be used to perform this modified Euclidean algorithm. H. M. Shao, T. K. Truong, I. S. Hsu, L. J. Deutsch and I. S. Reed, "A single chip VLSI Reed-Solomon decoder," presented at International Conference on Acoustics, Speech and Signal Processing, ICASSP, Tokyo, Japan, Apr. 7–11, 1986. An important advantage of that new recursive algorithm is that the entire systolic array needed to perform Euclid's algorithm requires substantially less silicon area than the pipeline version of the modified Euclidean algorithm, given in *IEEE Trans. on Computers*, May 1985, cited above.

Forney defined in "On decoding BCH codes," *IEEE Trans. on Information Theory*, vol. IT-11, 1965, pp. 549–557, an errata locator polynomial using what are now called Forney syndromes to correct both errors and erasures. Blahut showed, in *Theory and Practice of Error Control Codes*, Addison-Wesley Publishing Co., CA, May 1984, pp. 258, that the errata locator polynomial can be computed directly by initializing Berlekamp's algorithm with the erasure locator polynomial.

Recently W. L. Eastman, "Decoding erasures," The Mitre Corporation Report, Bedford, MA, 1986 suggested that the errata evaluator polynomial can be computer directly by initializing Berlekamp's algorithm with the Forney syndrome polynomial. By this technique, it is possible to compute the errata locator polynomial and the errata evaluator polynomial simultaneously from the Euclidean algorithm. This new RS decoder uses both the erasure locator polynomial and the Forney syndrome polynomial as initial conditions for the Euclidean algorithm.

It is shown and proved by T. K. Truong, W. L. Eastman, I. S. Reed, and I. S. Hsu, "A simplified procedure for correcting both errors and erasures of a Reed-Solomon code using the Euclidean algorithm," submitted to *Proc. IEE*, 1987 that the modified Euclidean algorithm mentioned above can be used to solve the Berlekamp-Massey key equation for the errata locator polynomial and the errata evaluator polynomial directly and simultaneously. By this means a new simplified pipeline architecture for both the time and transform domain decoders can be developed for correcting both errors and erasures of RS codes. Such a decoding technique can be faster and simpler than previous methods. See I. S. Reed, T. K. Truong and R. L. Miller, "Decoding of B.C.H. and RS codes with errors and erasures using continued fractions," *Electronics Letters*, vol. 15, no. 17, Aug. 16, 1976, pp. 542–544. I. S. Reed, T. K. Truong and R. L. Miller, "Simplified algorithm for correcting both errors and erasures of Reed-Solomon codes," *Proc. IEE*, vol. 126, no. 10, October 1979, pp. 961–963.

In this invention, it is found that the VLSI implementation of the transform domain decoder is simpler than the time domain decoder. However, for a long RS code, due to the large size of the inverse transform unit needed in the transform decoder, the VLSI area needed to implement the transform domain decoder can be substantially larger than that needed for the time domain detector. For moderately long codes, such as the (255,223) RS code used in the concatenated coding system for NASA's Voyager mission, the transform domain decoder is still simpler than the time domain decoder.

The above-mentioned NASA coding system is called the "baseline" system. It used a $(7,\frac{1}{2})$ convolutional code as its inner code and an 8-bit (255,223) RS code as its outer code. It is shown that this system achieves a bit-error rate (BER) of $10^{-6}$ at a bit signal-to-noise ratio (SNR) of 2.53 dB. See R. L. Miller, L. J. Deutsch and S. A. Butman, "On the error statistics of Viterbi decoding and the performance of concatenated codes," Publication 81-9, Jet Propulsion Laboratory, Pasadena, CA, September 1981.

As noted above, the time domain decoder is more efficient in area than the transform domain decoder for very long RS codes. One such example is the long, 10 bits/symbol (1023,959) RS code being presently considered for very deep space probes. If this code is concatenated with a (15,1/5) convolutional code, it achieves a BER of $10^{-6}$ at a SNR of 0.5 dB. Evidently the new NASA concatenated coding system provides a 2 dB improvement over the present baseline system. See J. H. Yuen and Q. D. Vo, "In search of a 2-dB coding gain," TDA Progress Report 42-83, Jet Propulsion Laboratory, Pasadena, CA, July-September 1985. It is for this reason and many other applications that it is important to develop an efficient, VLSI implementable, time-domain decoder to decode RS codes.

An algorithm was developed by I. S. Reed, T. K. Truong and R. L. Miller, "Decoding of B.C.H. and RS codes with errors and erasures using continued fractions," *Electronic Letters*, vol. 15, no. 17, Aug. 16, 1976, pp. 542–544 for time domain decoding RS codes to correct both errors and erasures by the use of continued fractions or its equivalent, Euclid's algorithm. This algorithm is a modification of the Berlekamp-Forney method. See G. D. Forney, "On decoding BCH codes," *IEEE Trans. on Information Theory*, vol. IT-11, 1965, pp. 549–557, and E. R. Berlekamp, *Algebraic Coding Theory*, McGraw-Hill, 1968. In this algorithm, the continued fraction algorithm is used to find the error locator polynomial from the remainder of the formal power series for the Forney syndrome. The disadvantage of this algorithm is that after the error locator polynomial is obtained by continued fractions, two polynomial multiplications are needed to compute the errata locator polynomial and the errata evaluator polynomial from the known error locator polynomial.

SUMMARY OF THE INVENTION

The present invention relates to a method and architecture for time or transform domain decoding of RS codes. It corrects both errors and erasures in the time domain decoding of RS codes by the use of the Euclidean algorithm without separate computations of the errata locator polynomial and the errata evaluator polynomial. This is possible because the errata evaluator polynomial $A(x)$ and the errata locator polynomial $\tau(x)$ can be obtained simultaneously from the Forney syndrome polynomial defined by $$T(x) = S(x)\Lambda(x) \bmod x^{d-1}$$

where $$S(x) = \frac{A(x)}{\lambda(x)\Lambda(x)} \bmod x^{d-1}, \tau(x) = \lambda(x)\Lambda(x)$$

The procedure for a time domain decoder is composed of the following five steps using equations set forth in the description of preferred embodiments:

(a) Compute the transform of the received m-tuple vector over $GF(2^m)$ from Eq. (2). Next calculate the erasure locator polynomial $\Lambda(x)$ from Eq. (4a) and define deg $\{\Lambda(x)\} = v$.
(b) Compute the Forney syndrome polynomial $T(x)$ in Eq. (7).
(c) To determine the errata locator polynomial $\tau(x)$ and errata evaluator polynomial $A(x)$, where $0 \leq v \leq d-1$, apply the Euclidean algorithm to $x^{d-1}$ and $T(x)$ as given by Eq. (7). The initial values of the Euclidean algorithm are $\tau_0(x) = \Lambda(x)$, $\tau_{311}(x) = 0$, $R_{311}(x) = x^{d-1}$ and $R_0(x) = T(x)$. The recursion in Eq. (9) for $R_s(x)$ and $\tau_s(x)$ terminates when $\deg\{R_s(x)\} \leq \lfloor(d+v-3)/2\rfloor$ for the first time for some value $s = s'$. Finally, compute $A(x)$ and $\tau(x)$ from Eqs. (10a) and (10b). For $v = d-1$, set $\tau(x) = \Lambda(x)$ and $A(x) = T(x)$.
(d) Compute the errata values from Eq. (11).

A transform domain decoder may also be used with this same method which differs only in the last step set forth above. For the time domain decoder, the errata locator polynomial $\tau(x)$ is processed by a Chien search operation, and by a unit which computes $[x^{111}\tau'(x)]^{-1}$. The errata evaluator polynomial $A(x)$, is used for a polynomial evaluation. The product of the errata evaluation polynomial and $[x^{111}\tau'(x)]^{-1}$ is computed as the magnitude of the error. The Chien search process is used to search for the error and erasure locations by finding the roots of $\tau(x)$. For the transform domain decoder, the errata locator polynomial $\tau(x)$ from the last step of the first part I and the syndromes from the initial syndrome computation from the first step of the first part I are subjected to a transform error pattern calculation which produces extended syndromes. The sequence of the error pattern is then inverted.

BRIEF DESCRIPTION OF THE DRAWINGS

FIG. 2 is an example of the Euclidean algorithm used to find $\tau(x)$ and $A(x)$ in FIGS. 1A and 1B.

DESCRIPTION OF PREFERRED EMBODIMENTS

The Time Domain Decoder for RS Codes

Figure 1A:
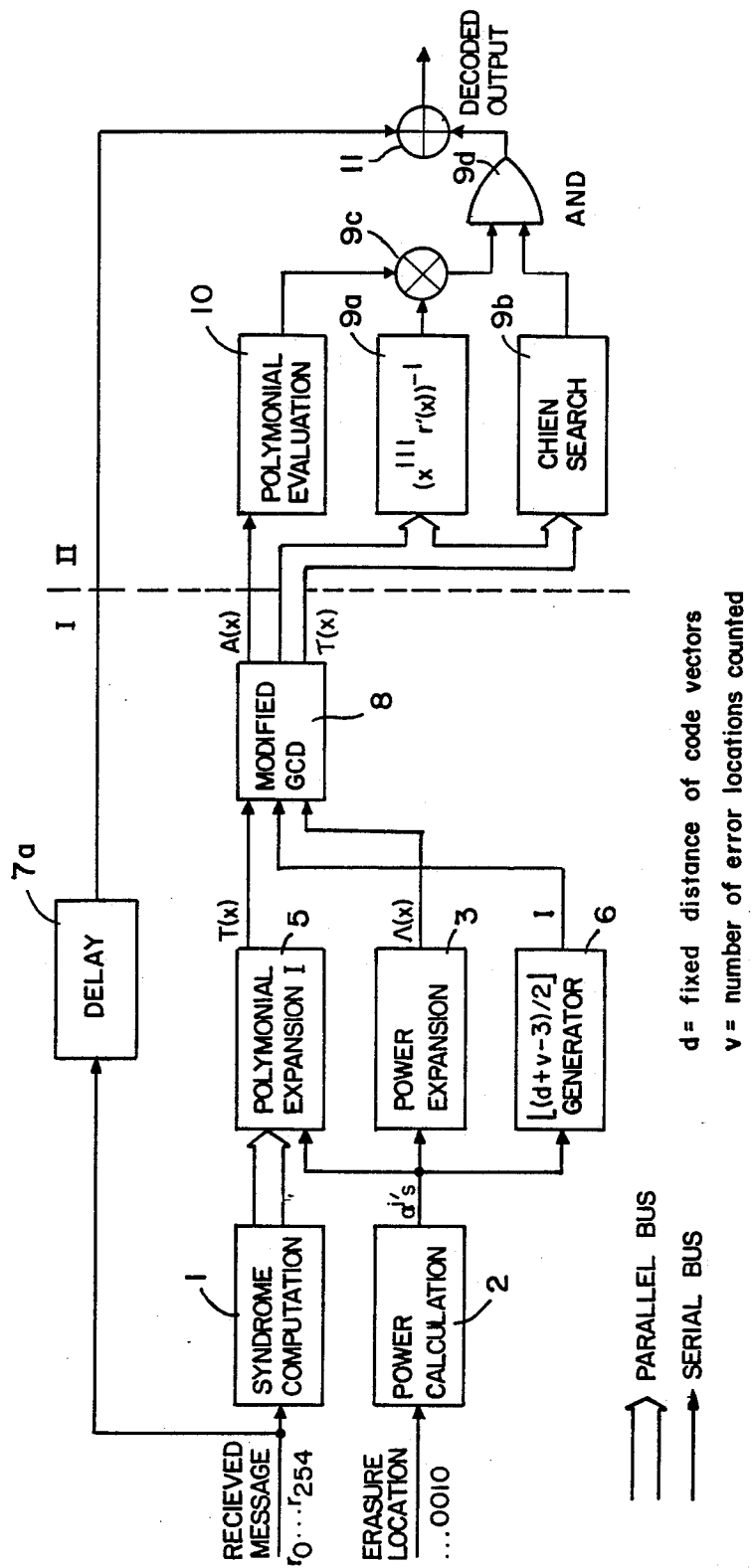
FIG. 1A illustrates a block diagram of a pipeline (255,233) RS time domain decoder suitable for VLSI fabrication.

In this section, a new algorithm for correcting both errors and erasures in the time domain decoding of RS codes, shown in FIG. 1A, is described. In this new algorithm, the Euclidean algorithm is used to solve the Berlekamp-Forney key equation for the errata locator polynomial and the errata evaluator polynomial directly and simultaneously. The advantage of this new algorithm over previous methods discussed by I. S.

Reed, T. K. Truong and R. L. Miller, "Decoding of B.C.H. and RS codes with errors and erasures using continued fractions," *Electronic Letters*, vol. 15, no. 17, Aug. 16, 1976, pp. 542-544, is that separate computations of the errata locator polynomial and the errata evaluator polynomial usually needed can be avoided. This new decoding algorithm is highly suitable for both VLSI and software implementation.

First, let $GF(2^m)$ be a finite Galois Field of $2^m$ elements. Also, let $N=2^m-1$ be the length of the (N,I) RS code over $GF(2^m)$ with minimum distance d, were $I=N-(d-1)$ denotes the number of m-bit message symbols and $d-1$ denotes the number of parity symbols such that $d-1$ is either an even or an odd integer.

Define the following five vectors:
$c=(c_0,c_1,\ldots,c_{N-1})$, code vector,
$r=(r_0,r_1,\ldots,r_{N-1})$, received vector,
$e=(e_0,e_1,\ldots,e_{N-1})$, error vector,
$u=(u_0,u_1,\ldots,u_{N-1})$, erasure vector,
$\underline{u}=(\underline{u}_0,\underline{u}_1,\ldots,\underline{u}_{N-1})$, errata vector.
These vectors are related by $\underline{u}=e+u$ and $r=c+u+e$.

Suppose that a number of errors (t) and erasures (v) occur in the received vector r, and assume that $v+2t \leq d-1$. Next let $\alpha$ be a primitive element in the $GF(2^m)$. Then $\gamma=\alpha^i$ is also a primitive element in $GF(2^m)$, where $(i,N)=1$.

To minimize the complexity of an RS encoder it is desirable that the generator polynomial by symmetric. If $\gamma$ is a root of the code's generator polynomial, it is shown by E. R. Berlekamp, "Bit-Serial Reed-Solomon Encoders," *IEEE Trans. on Information Theory*, vol. IT-28, no. 6, November 1982, pp. 869-874, that the generator polynomial $g(x)$ is symmetric, if and only if $$g(x) = \prod_{i=b}^{b+(d-2)} (x - \gamma^i) = \sum_{i=0}^{d-1} g_i x^i, \tag{1}$$

where $g_0=g_{d-1}=1$ and b satisfies the equality $2b+d-2=2^m-1$. The syndromes of the code are given by $$S_{(b-1)+k} = \sum_{i=0}^{N-1} \underline{u}_i \gamma^{i(b-1+k)} = \sum_{i=0}^{N-1} (u_i + e_i) \gamma^{i(b-1+k)} \tag{2}$$

$$= \sum_{j=1}^{v+t} Y_j X_j^{(b-1)+k} \text{ for } 1 \leq k \leq d-1$$

where $X_j$ is either the $j^{th}$ erasure or error location, and $Y_j$ is either the $j^{th}$ erasure or error magnitude. Define the set, $\Lambda=\{X_i | X_i \text{ is an erasure location}\}$ and $\lambda=\{X_1 | X_i \text{ is an error location}\}$. Define the syndrome polynomial as $$S(x) = \sum_{k=1}^{d-1} S_{(b-1)+k} x^{k-1} \tag{3a}$$

Then it is not difficult to show (see E. R. Berlekamp, *Algebraic Coding Theory*, McGraw-Hill, 1968) that $$S(x) = \sum_{k=1}^{d-1} S_{(b-1)+k} x^{k-1} = \tag{3b}$$

$$\sum_{j=1}^{v+t} \frac{Y_j X_j^b}{(1 - X_j x)} - \sum_{j=1}^{v+t} \frac{Y_j X_j^{b+d-1}}{(1 - X_j x)}$$

Following *Algebraic Coding Theory*, define four different polynomials in the following manner. The erasure locator:

$$\Lambda(x) = \prod_{X_j \in \Lambda} (1 - X_j x) = \prod_{j=1}^{v} (1 - X_j x) = \sum_{j=0}^{v} (-1)^j \Lambda_j x^j \tag{4a}$$

The error locator:

$$\lambda(x) = \prod_{X_j \in \lambda} (1 - X_j x) = \prod_{j=1}^{t} (1 - X_j x) = \sum_{j=0}^{t} (-1)^j \lambda_j x^j \tag{4b}$$

The errata locator:

$$\tau(x) = \Lambda(x)\lambda(x) = \prod_{j=1}^{v+t} (1 - X_j x) = \sum_{j=0}^{v+t} (-1)^j \tau_j x^j \tag{4c}$$

$\tau_0=1$. The errata evaluator:

$$A(x) = \sum_{j=1}^{v+t} Y_j X_j^b \left( \prod_{i \neq j} (1 - X_i x) \right) \tag{4d}$$

In terms of the polynomials defined above, Eq. (3b) becomes $$S(x)\tau(x) = A(x) + x^{d-1} \sum_{j=1}^{v+t} Y_j X_j^{b+d-1} \left( \prod_{i \neq j} (1 - X_i x) \right) \tag{5}$$

From Eq. (5), one obtains the congruence relation, $$S(x)\tau(x) \equiv A(x) \bmod x^{d-1} \tag{6a}$$

It is shown in T. K. Truong, W. L. Eastman, I. S. Reed, and I. S. Hsu, "A simplified procedure for correcting both errors and erasures of a Reed-Solomon code using the Euclidean algorithm," submitted to *Proc. IEE*, 1987, that Eq. (6a) can be solved to yield $$S(x) \equiv \frac{A(x)}{\lambda(x)\Lambda(x)} \bmod x^{d-1} \tag{6b}$$

It is well known, e.g. see I. S. Reed, T. K. Truong and R. L. Miller, "Decoding of B.C.H. and RS codes with errors and erasures using continued fractions," *Electronics Letters*, vol. 15, no. 17, Aug. 16, 1976, pp. 542-544., that the maximum number of errors in an RS code which can be corrected is $\lfloor (d-1-v)/2 \rfloor$ where $\lfloor x \rfloor$ denotes the greatest integer less than or equal to x, i.e., the principal part of x, or expressed differently, it means "greatest integer $\leq x$," discarding any fractions. In this expression $\lfloor (d+v-3)/2 \rfloor$, d is a fixed number (designed distance of code) and v is the number of error locations counted. Now define the Forney syndrome polynomial.

DEFINITION 1

The Forney syndrome polynomial is defined by $$T(x) \equiv S(x)\Lambda(x) \bmod x^{d-1} \tag{7}$$

By Eq. (7), the key part of Eq. (6b) for $\lambda(x)$ and $A(x)$ is:

$$T(x) = \frac{A(x)}{\lambda(x)} \bmod x^{d-1} \quad (8)$$

where deg $\{\lambda(x)\} \leq \lfloor(d-1-v)/2\rfloor$ and deg $\{A(x)\} \leq (d+v-3)/2$. It is shown in the following important theorem that the errata evaluator polynomial $A(x)$ and the errata locator polynomial $\tau(x)$ can be obtained simultaneously and simply from the known $T(x)$ in Eq. (7), and the new key Eq. (8), which takes into account both errors and erasures.

THEOREM 1

Let $T(x)$ in Eq. (7) be the Forney syndrome polynomial of a t-error and v-erasure correcting RS code under the condition $v+2t \leq d-1$ where $d-1$ is either an even or an odd integer. Consider the two polynomials $M(x)=x^{d-1}$ and $T(x)=S(x)\Lambda(x) \bmod x^{d-1}$. Then the Euclidean algorithm for polynomials on $GF(2^m)$ can be used to develop two finite sequences $R_s(x)$ and $\tau_s(x)$ from the following two recursive formulas:

$$\tau_s(x) = (-q_{s-1}(x))\tau_{s-1}(x) + \tau_{s-2}(x) \quad (9a)$$

and $$R_s(x) = R_{s-2}(x) - q_{s-1}(x)R_{s-1}(x) \quad (9b)$$

for $(s=1,2,\ldots)$, where the initial conditions are $\tau_0(x)=\Lambda(x), \tau_{-1}(x)=0$, $R_{-1}(x)=M(x)$, and $R_0(x)=T(x)$. Here $q_{s-1}(x)$ is obtained as the principal part of $R_{s-2}(x)/R_{s-1}(x)$. The recursion in Eq. (9) for $R_s(x)$ and $\tau_s(x)$ terminates when deg $\{R_s(x)\} \leq \lfloor(d+v-3)/2\rfloor$ for the first time for some value $s=s'$. Let $$A(x) = R_{s'}(x)/\Delta \quad (10a)$$

and $$\tau(x) = \tau_{s'}(x)/\Delta \quad (10b)$$

Also in Eq. (10b), $\Delta = \tau_{s'}(0)$ is a field element in $GF(2^m)$ which is chosen so that $\tau_0 = 1$. Then $A(x)$ and $\tau(x)$ in Eq. (10) are the unique solutions of $$A(x) = T(x)\tau(x) \bmod x^{d-1} \quad (10c)$$

where both the inequalities, deg $\{\tau(x)\} \leq \lfloor(d+v-1)/2\rfloor$ and deg $\{A(x)\} \leq \lfloor(d+v-3)/2\rfloor$, are satisfied.

Proof: See T. K. Truong, W. L. Eastman, I. S. Reed, and I. S. Hsu, "A simplified procedure for correcting both errors and erasures of a Reed-Solomon code using the Euclidean algorithm," submitted to *Proc. IEE*, 1987.

Theorem 1 is a proof that the idea in W. L. Eastman, "Decoding Erasures," The Mitre Corporation Report, Bedford, MA, 1986 is correct.

The roots of $\tau(x)$ are the inverse locations of the t error and v erasures, referred to hereinafter as t and v, respectively. These roots are most efficiently found by the Chien search procedure. By Eq. (4d), it is shown readily that the errata values are $$Y_k = \frac{A(X_k^{-1})}{(X_k^{b-1}\tau'(X_k^{-1}))} \text{ for } 1 \leq k \leq v+t \quad (11)$$

where $\tau'(x_k^{-1})$ is the derivative with respect to x of $\tau(x)$, evaluated at $x=X_k^{-1}$.

The overall time domain decoding of RS codes for correcting errors and erasures using the Euclidean algorithm is summarized in the following steps:

(a) Compute the transform of the received m-tuple m-bit vector over $GF(2^m)$ from Eq. (2). Next calculate the erasure locator polynomial $\Lambda(x)$ from Eq. (4a) and define deg $\{\Lambda(x)\}=v$.

(b) Compute the Forney syndrome polynomial from $T(x)$ in Eq. (7).

(c) To determine the errata locator polynomial $\tau(x)$ and errata evaluator polynomial $A(x)$, where $0 \leq v < d-1$, apply the Euclidean algorithm to $x^{d-1}$ and $T(x)$ as given by Eq. (7). The initial values of the Euclidean algorithm are $\tau_0(x)=\Lambda(x), \tau_{-1}(x)=0, R_{-1}(x)=x^{d-1}$ and $R_0(x)=T(x)$. The recursion in Eq. (9) for $R_s(x)$ and $\tau_s(x)$ terminates when deg $\{R_s(x)\} \leq \lfloor(d+v-3)/2\rfloor$ for the first time for some value $s=s'$. Finally, compute $\tau(x)$ and $A(x)$ from Eqs. (10a) and (10b). For $v=d-1$, set $\tau(x)=\Lambda(x)$ and $A(x)=T(x)$.

(d) Compute the errata values from Eq. (11).

To illustrate the time domain decoding procedure for correcting errors and erasures, an elementary example of an RS code over $GF(2^4)$ is now presented. The representation of the field $GF(2^4)$ generated by the primitive irreducible polynomial $g(x)=x^4+x+1$ is given in the following Table A.

TABLE A

|  | $\alpha^3$ | $\alpha^2$ | $\alpha$ | $\alpha^0$ |
|---|---|---|---|---|
| $\alpha^0$ | 0 | 0 | 0 | 1 |
| $\alpha^1$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

EXAMPLE 1

Consider a (15,9) RS code over $GF(2^4)$ with minimum distance $d=7$. In this code, v erasures and t errors under the condition $2t+v \leq d-1$ can be corrected. In order to simplify this example, let $\gamma=\alpha$ and $b=1$. Thus, the generator polynomial of such a (15,9) RS code is defined by $$g(x) = \prod_{i=1}^{6}(x-\alpha^i) =$$

$$x^6 + \alpha^{10}x^5 + \alpha^{14}x^4 + \alpha^4x^3 + \alpha^6x^2 + \alpha^9x + \alpha^6$$

Assume the message symbols are $$I(x) = \alpha^{10}x^{14} + \alpha^{12}x^{13} + \alpha^8x^{12} + \alpha^5x^{11} + \alpha^6x^{10} + \alpha^{14}x^9 + \alpha^{13}x^8 + \alpha^{11}x^7 + \alpha^9x^6.$$

The encoded codeword, which is a multiple of $g(x)$, is $$c(x) = \alpha^{10}x^{14} + \alpha^{12}x^{13} + \alpha^8x^{12} + \alpha^5x^{11} + \alpha^6x^{10} + \alpha^{14}x^9 + \alpha^{13}x^8 + \alpha^{11}x^7 + \alpha^9x^6 + x^5 + \alpha x^4 + \alpha^2 x^3 + \alpha^6 x^2 + \alpha^{12}x + \alpha^8.$$

Written as a vector, the codeword is $$c = (\alpha^{10}, \alpha^{12}, \alpha^8, \alpha^5, \alpha^6, \alpha^{14}, \alpha^{13}, \alpha^{11}, \alpha^9, \alpha^0, \alpha, \alpha^2, \alpha^6, \alpha^{12}, \alpha^8).$$

Assume the erasure vector is $$u = (0,0,0,0,0,0,0,\alpha^2,0,0,0,0,0,0,0) \quad (12)$$

and error vector is $$e = (0,0,0,0,\alpha^{11},0,0,0,0,0,\alpha^7,0,0,0) \quad (13)$$

Then the errata vector is $$\bar{u} = u + e = (0,0,0,0,\alpha^{11},0,0,\alpha^2,0,0,0,\alpha^7,0,0,0) \quad (14)$$

Assume the received vector is $$r = c + \bar{u} = (\alpha^{10}, \alpha^{12}, \alpha^8, \alpha^5, \alpha, \alpha^{14}, \alpha^{13}, \alpha^9, \alpha^9, \alpha^0, \alpha, \alpha^{12}, \alpha^6, \alpha^{12}, \alpha^8) \quad (15)$$

The syndromes $S_k$ for $r$ are $$S_k = \sum_{n=0}^{14} r_n \alpha^{nk} = \alpha^7(\alpha^3)^k + \alpha^2(\alpha^7)^k + \alpha^{11}(\alpha^{10})^k \text{ for } 1 \leq k \leq 6.$$

This yields $S_1 = \alpha^0$, $S_2 = \alpha^{13}$, $S_3 = \alpha^{14}$, $S_4 = \alpha^{11}$, $S_5 = \alpha$, and $S_6 = 0$. Thus, the syndrome polynomial is $S(x) = \alpha^0 + \alpha^{13}x + \alpha^{14}x^2 + \alpha^{11}x^3 + \alpha x^4 + 0x^5$.

The erasure locator polynomial is $\Lambda(x) = (1 + \alpha^7 x)$. In this example, the maximum erasure correcting capability is $\lfloor (d-1-v)/2 \rfloor = \lfloor (7-1-1)/2 \rfloor = 2$. By Eq. (7), one obtains the Forney syndrome polynomial as $$T(x) \equiv \Lambda(x)S(x) \equiv (1 + \alpha^7x)(1 + \alpha^{13}x + \alpha^{14}x^2 + \quad (16)$$

$$\alpha^{11}x^3 + \alpha x^4 + 0x^5) \bmod x^6 \equiv (0x^6 + \alpha^8 x^5 + \alpha^9 x^4 + \alpha x^3 +$$

$$\alpha^{12}x^2 + \alpha^5 x + \alpha^0) \bmod x^6 = \alpha^8 x^5 + \alpha^9 x^4 +$$

$$\alpha x^3 + \alpha^{12}x^2 + \alpha^5 x + \alpha^0$$

In Eq. (16), the coefficients of $T(x)$, $T_0 = \alpha^0$, $T_1 = \alpha^5$, $T_2 = \alpha^{12}$, $T_3 = \alpha$, $T_4 = \alpha^9$, and $T_5 = \alpha^8$ are the Forney syndromes.

The Euclidean algorithm is applied next to polynomial $x^{d-1}$ and $T(x)$ in Eq. (16). By this means, polynomials $\tau(x)$ and $A(x)$ are determined next by use of the Euclidean algorithm. This is accomplished by the recursive Eqs. (9a) and (8b) as illustrated in Table 1 shown in FIG. 2 where initially $R_{-1}(x) = x^{d-1} = x^6$ and $R_0(x) = \alpha^8 x^5 + \alpha^9 x^4 + \alpha x^3 + \alpha^{12}x^2 + \alpha^5 x + 1$. From Table 1, it is seen that deg $\{R_{s'}(x)\} = $ deg $\{R_2(x)\} = 2 \leq \lfloor (d+v-3)/2 \rfloor = 2$. Thus, the computation terminates at this point $s' = 2$, and $$R_2(x) = \alpha^7 x^2 + \alpha x + \alpha^2 \quad (17a)$$

and $$r_2(x) = \alpha^7 x^3 + \alpha^{13}x^2 + \alpha^4 x + \alpha^2 \quad (17b)$$

By Eqs. (10a) and (10b), one has $$\tau(x) = \frac{1}{\alpha^2} r_2(x) = \alpha^5 x^3 + \alpha^{11}x^2 + \alpha^2 x + 1 \quad (18)$$

and $$A(x) = \frac{1}{\alpha^2} R_2(x) = \alpha^5 x^2 + \alpha^{14} x + 1 \quad (19)$$

By use of Chien search, the roots of $\tau(x)$ constitute the set $\{\alpha^{-7}, \alpha^{-3}, \alpha^{-10}\}$. The derivative with respect to x of $\tau(x)$ in Eq. (18) is $\tau'(x) = \alpha^5 x^2 + \alpha^2$. Thus, the errata values are $$Y_1 = \frac{A(X_1^{-1})}{\tau'(X_1^{-1})} = \frac{A(\alpha^{-7})}{\tau'(\alpha^{-7})} =$$

$$\frac{\alpha^5(\alpha^{-7})^2 + \alpha^{14}(\alpha^{-7}) + 1}{\alpha^5(\alpha^{-7})^2 + \alpha^2} = \alpha^2,$$

$$Y_2 = \frac{A(X_2^{-1})}{\tau'(X_2^{-1})} = \frac{\alpha^5(\alpha^{-3})^2 + \alpha^{14}(\alpha^{-3}) + 1}{\alpha^5(\alpha^{-3})^2 + \alpha^2} = \alpha^7,$$

and $$Y_3 = \frac{A(X_3^{-1})}{\tau'(X_3^{-1})} = \frac{\alpha^5(\alpha^{-10})^2 + \alpha^{14}(\alpha^{-10}) + 1}{\alpha^5(\alpha^{-10})^2 + \alpha^2} = \alpha^{11}.$$

THE TRANSFORM DECODER FOR RS CODES

The transform decoder of Gore and Mandelbaum (W. C. Gore, "Transmitting binary symbols with Reed-Solomon code," John Hopkins EE Report 73-75, April 1973, and D. Mandelbaum, "On decoding Reed-Solomon codes," *IEEE trans. on Information Theory*, vol. IT-17, 1971, pp. 701-712) was developed further in I. S. Reed, T. K. Truong and R. L. Miller, "Simplified algorithm for correcting both errors and erasures of Reed-Solomon codes," *Proc. IEE*, vol. 126, no. 10, October 1979, pp. 961-963 to correct both errors and erasures. This decoding procedure was based on the algorithm orginally invented by Forney, "On decoding BCH codes," *IEEE Trans. on Information Theory*, vol. IT-11, 1965, pp. 549-557. (See also I. S. Reed, T. K. Truong and R. L. Miller, "Simplified algorithm for correcting both errors and erasures of Reed-Solomon codes," *Proc. IEE*, vol. 126, no. 10, October 1979, pp. 961-963.) By the above-mentioned Euclidean algorithm, the transform domain decoding procedure in *Proc. IEE* just cited can be simplified further.

By the same procedure used in the time domain decoder, one can obtain the errata locator polynomial given in Eq. (4c). Hence, $$\tau(X_i^{-1}) = 1 + (-1)\tau_1(X_i^{-1}) + (-1)^2\tau_2(X_i^{-1})^2 + \ldots + \quad (20)$$

$$(-1)^{v+t}\tau_{v+t}(X_i^{-1})^{v+t} = 0 \text{ for } 1 \leq i \leq v+t$$

Multiplying Eq. (20) by $Y_i X_i^{(b-1)+k}$ yields $$Y_i X_i^{(b-1)+k} - \quad (21)$$

$$\tau_1 Y_i X_i^{(b-1)+k-1} + \ldots (-1)^{v+1}\tau_{v+t}Y_i X_i^{(b-1)+k-(v+t)} = 0$$

Summing Eq. (21) over i for $1 \leq i \leq v+t$, produces $$\sum_{i=1}^{v+t} Y_i X_i^{(b-1)+k} - \tau_1 \sum_{i=1}^{v+t} Y_i X_i^{(b-1)+k-1} + \quad (22)$$

$$\ldots (-1)^{v+t} \tau_{v+t} \sum_{i=1}^{v+t} Y_i X_i^{(b-1)+k-(v+t)} = 0$$

From Eq. (22), one has $$S_{(b-1)+k} - \tau_1 S_{(b-1)+k-1} + \quad (23)$$

$$\ldots (-1)^{v+t} \tau_{t+v} S_{(b-1)+k-(v+t)} = 0$$

Hence, in general, $$E_{(b-1)+k} - \tau_1 E_{(b-1)+k-1} + \quad (24)$$

$$\ldots (-1)^{t+v} \tau_{t+v} E_{(b-1)+k-(v+t)} = 0 \text{ for } k \geq d$$

are the recursive equations for $E_j$, the transforms of the errata pattern, where initially $E_b = S_b$, $E_{b+1} = S_{b+1}, \ldots, E_{b+d-2} = S_{b+d-2}$ are known from the prior syndrome calculation.

From Eq. (24), one obtains the rest of the transform of $\bar{u}$, i.e., the $S_l$ for $0 \leq l \leq N-1$. The amplitude $\bar{u}$ vector is found by taking the inverse transform over $GF(2^m)$ of $S_l$, $0 \leq l \leq N-1$. Finally, the original m-tuple code vector can be obtained by subtracting $\bar{u}$ from the received vector $r$.

The above transform decoding algorith of RS codes for correcting both errors and erasures, using transforms over $GF(2^m)$ and the Euclidean aglorithm will now be recapitulated. This procedure is composed of the following five steps:

(a) Use step (a) in the time domain decoder.
(b) Use step (b) in the time domain decoder.
(c) Use step (c) in the time domain decoder.
(d) Compute the rest of the transform of the errata vector by the use of Eq. (24).
(e) Invert the transform to recover the errata vector using the fact that $S_0 = S_N$.

Then obtain the corrected code vector.

To illustrate the transform domain decoder for correcting errors with erasures, the data for the (15,9) RS code over $GF(2^4)$ used in Example 1 is again used.

EXAMPLE 2

Consider the (15,9) RS code over $GF(2^4)$ with $d=7$.

For this code, the erasure, error, errata, and received vector are given by Eqs. (12), (13), (14) and (15), respectively. By Eq. (18), the errata locator polynomial is $$\tau(x) = \tau_0 + \tau_1 x + \tau_2 x^2 + \tau_3 x^3 = 1 + \alpha^2 x + \alpha^{11} x^2 + \alpha^5 x^3$$

where $\tau_0 = 1$, $\tau_1 = \alpha^2$, $\tau_2 = \alpha^{11}$, and $\tau_3 = \alpha^5$.

By Eq. (23), the rest of the transform of the errata vector is $$S_k = \alpha^2 S_{k-1} + \alpha^{11} S_{k-2} + \alpha^5 S_{k-3}, \text{ for } 7 \leq 15. \quad (25)$$

That is, $S_7 = \alpha_{13}$, $S_8 = \alpha^{13}$, $S_9 = \alpha^7$, $S_{10} = \alpha^3$, $S_{11} = \alpha^5$, $S_{12} = \alpha^{13}$, $S_{13} = \alpha^5$, $S_{14} = \alpha^5$, and $S_0 = 1$. The inverse transform of $S_k$ is $$\bar{u}_k = \sum_{n=0}^{15-1} S_n \alpha^{-nk} \text{ for } 0 \leq k \leq 14 \quad (26)$$

The result is $\bar{u} = (0,0,0,0,\alpha^{11}, 0,0,\alpha^2,0,0,0,\alpha^7,0,0,0)$. The corrected code is thus $$c = r - \bar{u} = (\alpha^{10}, \alpha^{12}, \alpha^8, \alpha^5, \alpha, \alpha^{14}, \alpha^{13}, \alpha^9, \alpha^9, \alpha^0, \alpha, \alpha^{12}, \quad (27)$$

$$\alpha^6, \alpha^{12}, \alpha^8) - (0,0,0,0, \alpha^{11}, 0,0, \alpha^2, 0,0,0, \alpha^7, 0,0,0,) = (\alpha^{10}, \alpha^{12},$$

$$\alpha^8, \alpha^5, \alpha^6, \alpha^{14}, \alpha^{13}, \alpha^{11}, \alpha^9, \alpha^0, \alpha, \alpha^2, \alpha^6, \alpha^{12}, \alpha^8).$$

IMPLEMENTATION OF VLSI ARCHITECTURE OF THE TRANSFORM DECODER AND THE TIME DOMAIN DECODER

Figure 1B:
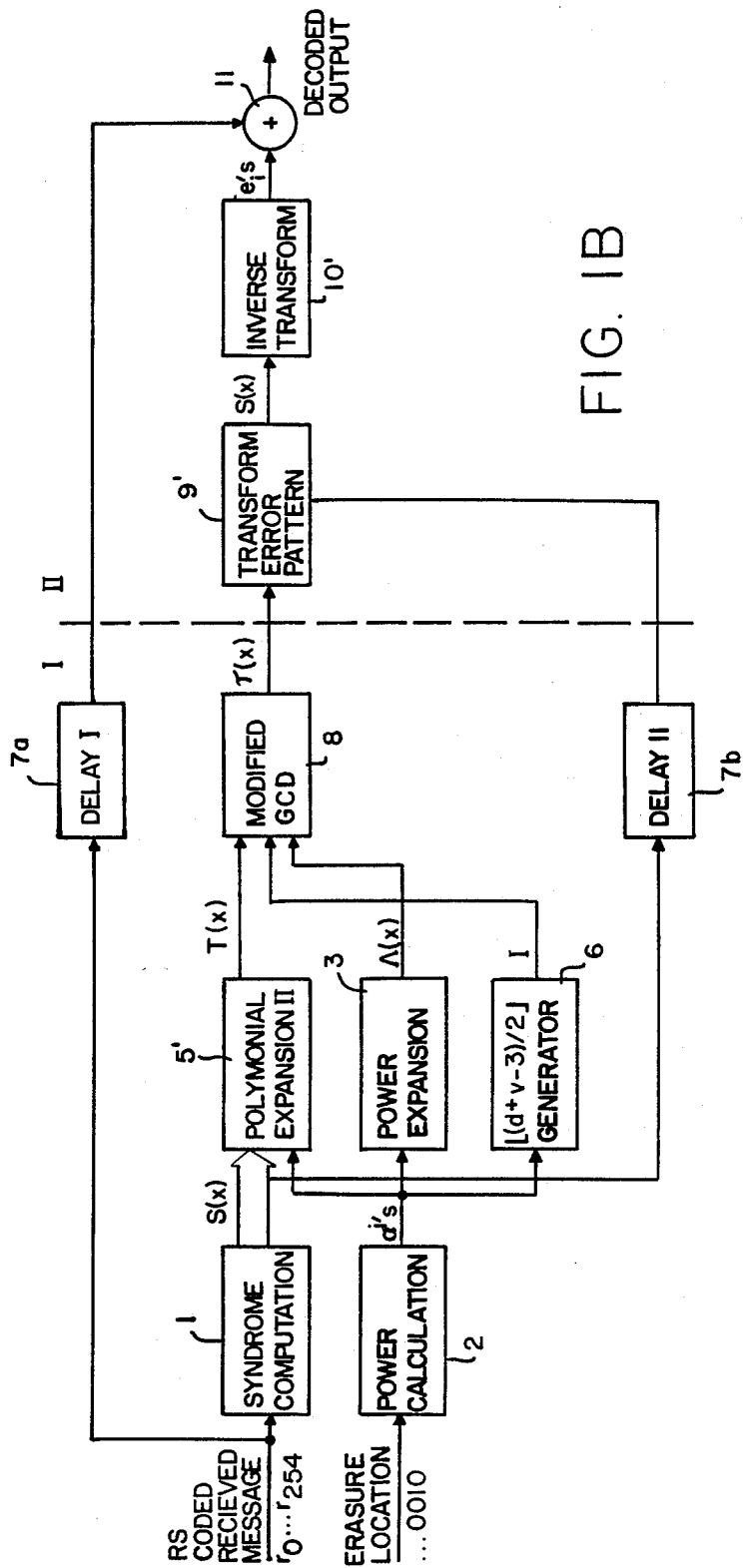
FIG. 1B illustrates a block diagram of a pipeline (255,233) RS transform domain decoder very similar to the time domain decoder in the first part I, but simpler in the second part II, although less suitable for VLSI fabrication in longer length RS codes.

In the description that follows of the various functional blocks in FIGS. 1A and 1B, it should be understood that what is disclosed in those figures are digital systems which are customarily synchronized by a clock signal from a common source. It therefor follows that the various blocks to be described below are all synchronized by clock signals to registers, latches, detectpors and the like. The synchronizing clock system is not shown in order that the figures not be cluttered with what those skilled in the art understand to be implied.

FIG. 1A depicts a block diagram of a (255,223) RS time domain decoder. FIG. 1B shows the block diagram of a (255,223) RS transform domain decoder. Each block diagram can be separated into two parts I and II, separated by dashed lines, as shown in both FIGS. 1A and 1B. The first part I in both block diagrams has similar VLSI architectures. The major functional units in this part are: the syndrome computation unit 1, the power calculation unit 2, the power expansion unit 3, the polynomial expansion unit 5 for the decoder of FIG. 1A and 5' for the decoder of FIG. 1B, and the $\lfloor (d+v-3)/2 \rfloor$ generator 6. Also included in this part are some delay registers 7a in FIG. 1A and delay registers 7a and 7b in FIG. 1B, and a modified GCD 8. The lengths of the delay registers may not be equal in these two decoder architectures, but since they contain only replicated register cells, they can be considered identical in architecture.

Figure 3:
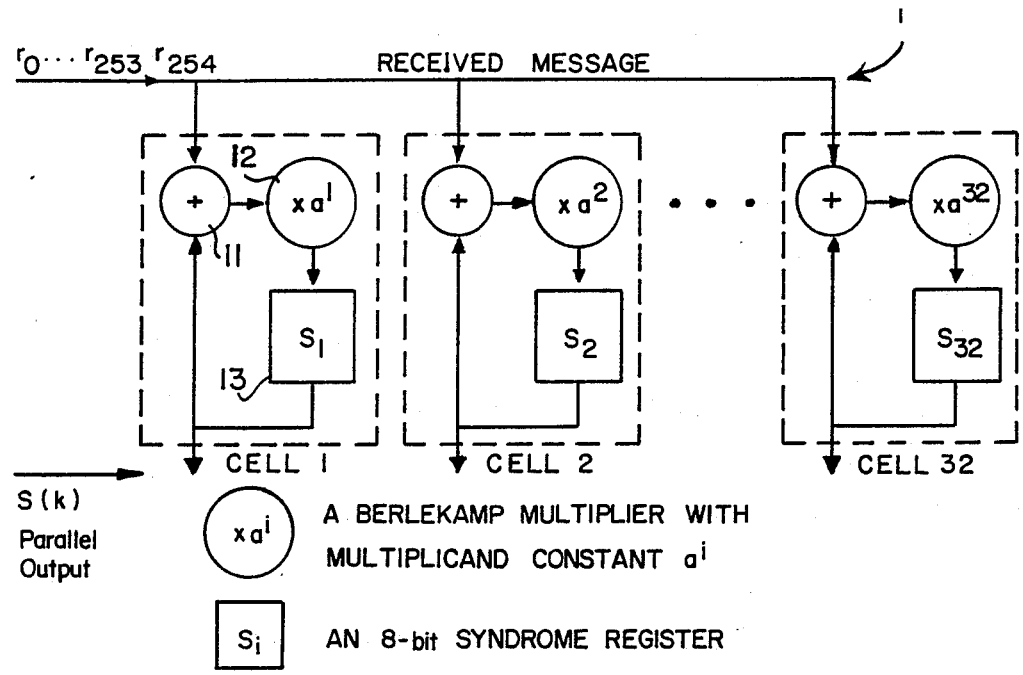
FIG. 3 is a block diagram of the syndrome computation in FIGS. 1A and 1B.

FIG. 3 shows a block diagram of the syndrome computation 1. This unit accepts the received messages and computes their syndromes $S(x)$. There are 32 syndrome cells in a (255,223) RS decoder. Each cell 1, 2 ... 32 depicted in FIG. 3 performs the operation as $S_i \leftarrow (S_i + r_i \alpha^i)$, where "$\leftarrow$" deotes the operation "is replaced by". The three elements of each replicated cell perform the same operation. Element 11 is an adder, element 12 is a multiplier with a multiplicand constant $\alpha^i$, where i is the number of the cell, and element 13 is an eight bit register. The Berlekamp multiplier is used in this syndrome unit for the multiplier 12 due to its simplicity in VLSI design. The computed syndrome polynomial is labelled as $S(x)$ in both FIGS. 1A and 1B. In the time domain and transform domain decoders, the coefficients of $S(x)$ are fed in parallel to the polynomial expansion unit 5 or 5', to compute the Forney syndromes.

Figure 4:
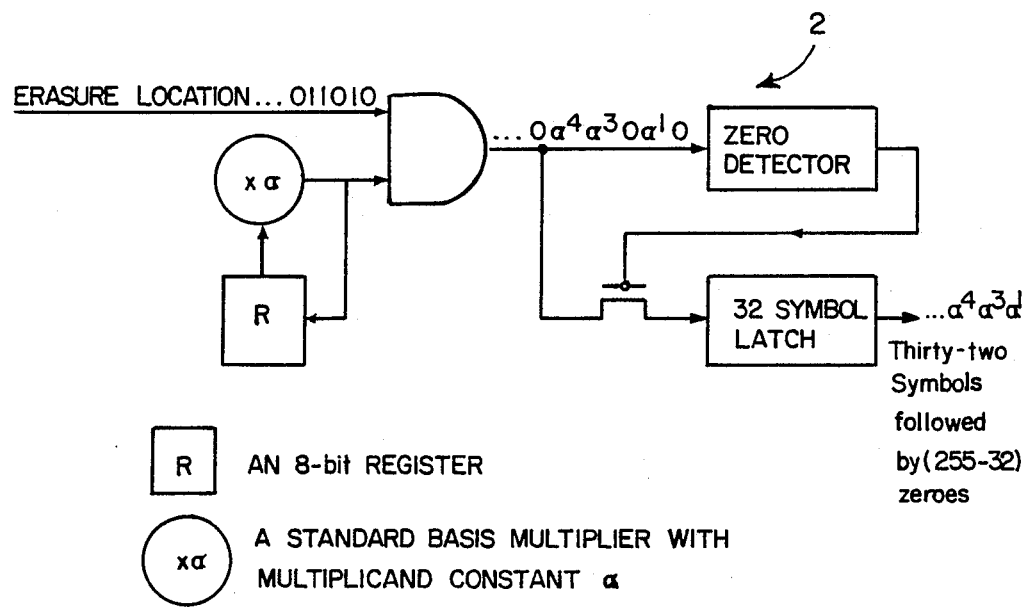
FIG. 4 is a block diagram of the power calculation in FIGS. 1A and 1B.

FIG. 4 shows the block diagram of the power calculation 2 which converts the received 1's and 0's into a sequence of $\alpha^k$'s and 0's, where $\alpha$ is a primitive element of the finite field over which the RS code is defined. The 1's and 0's received at AND gate 21 indicate the occurrence or nonoccurrence, respectively, of an erasure at a specific location. Since the maximum erasure correcting capability of a (255,223) RS decoder is 32, only 32 symbol latches in block 22 are needed to store the locations of all the correctable erasures. However, the output of the content of the 32 symbol latches is followed by 255-32 zeroes. A register R stores an 8-bit symbol which is read out in synchronism with each erasure location symbol into a multiple unit labeled "xα," and then restored. When that recirculated symmbol is applied to the AND gate 21 in synchronism with an erasure location symbol, it produces an erasure location symbol bit $\alpha^k$ in the kth position of the 32 erasure location symbols, shown as $\alpha^1$, $\alpha^3$, and $\alpha^4$. The other 32 symbol positions are filled with symbol zeros, as are the remaining 255 symbol positions after 32 erasure location symbols.

A zero detector 23 for detecting the occurrence of erasures is included in the power calculation unit. If an erasure occurs at the $k^{th}$ location, its corresponding symbol $\alpha^k$ is calculated and stored in the proper latch position. The sequence of $\alpha^k$'s is fed to the polynomial expansion unit, to the power expansion unit, and to the $\lfloor (d+v-3)/2 \rfloor$ generator.

Figure 5:
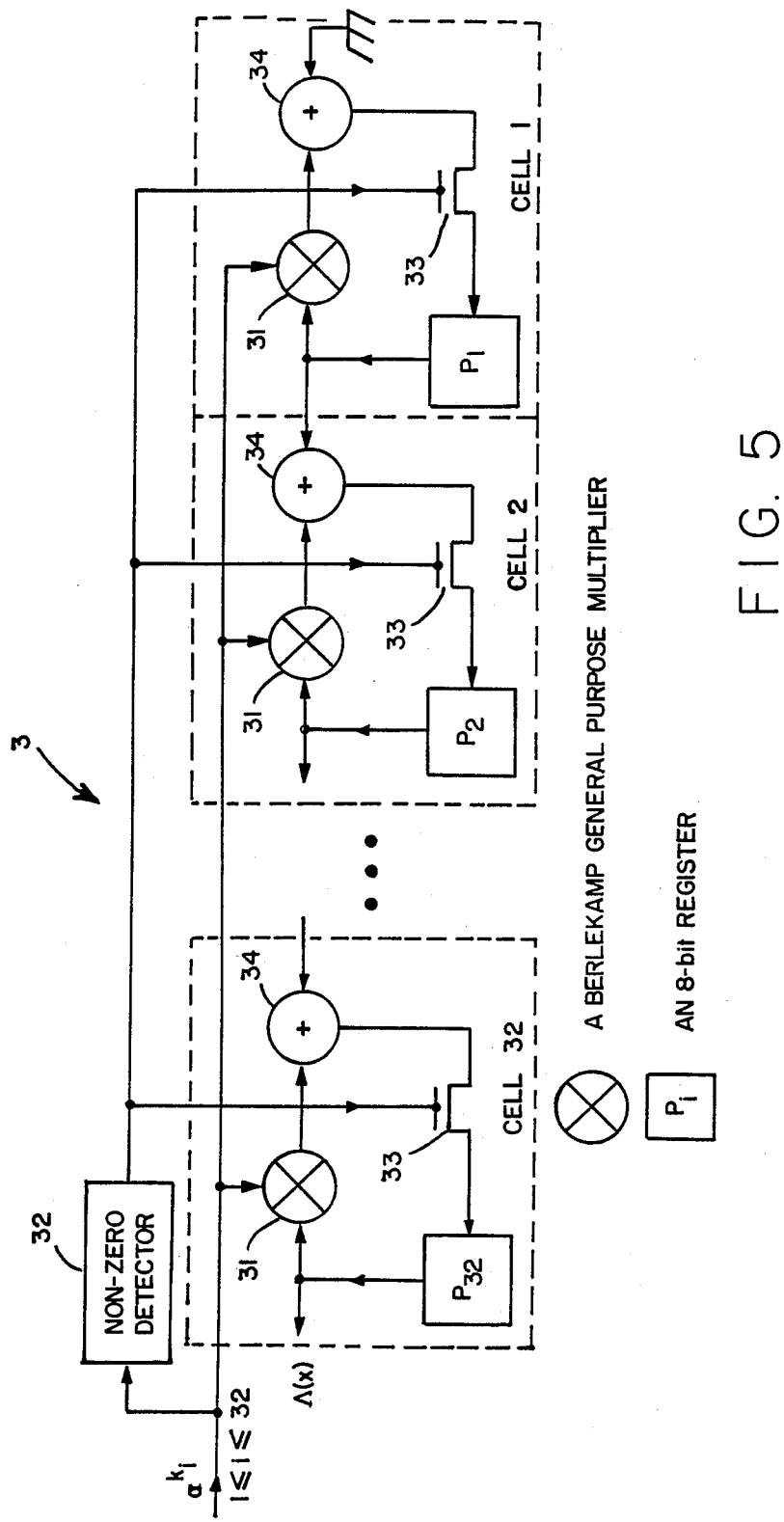
FIG. 5 is a block diagram of the power expansion in FIGS. 1A and 1B.

The power expansion unit 3 converts the $\alpha^k$'s sequence into an erasure locator polynomial $\Lambda(x)$ which has $\alpha^k$'s as its roots. FIG. 5 depicts the block diagram of this unit. The $\alpha^k$'s are applied to thirty-two multipliers 31 in parallel, and to a nonzero detector 32. For each nonzero $\alpha^{ki}$ detected, a gate 33 is opened to store the sum of the produce $P_i \times \alpha^{ki}$ and the previous sum of the previous register $P_{i-1}$. Each register $P_1$ through $P_{32}$ is an 8-bit register. The sum is formed by an adder 34. Note that the adder associated with the register $P_1$ always adds zero to the product $P_1 \times \alpha^{ki}$. The output of the power expansion unit is the erasure locator polynomial $\Lambda(x)$ which is fed serially out of the register $P_{32}$ to the modified GCD (greatest common denominator calculator) unit 8 as one of the initial conditions.

The generator 6 is used to compute $\lfloor (d+v-3)/2 \rfloor$ as noted hereinbefore. This is shown in both FIGS. 1A and 1B. The output of this generator, which is implemented in a straight forward way to add d and v, subtract 3 and divide by 2, is sent to the modified GCD unit 8 and used as a stop indicator for the Euclid's algorithm.

Figure 6:
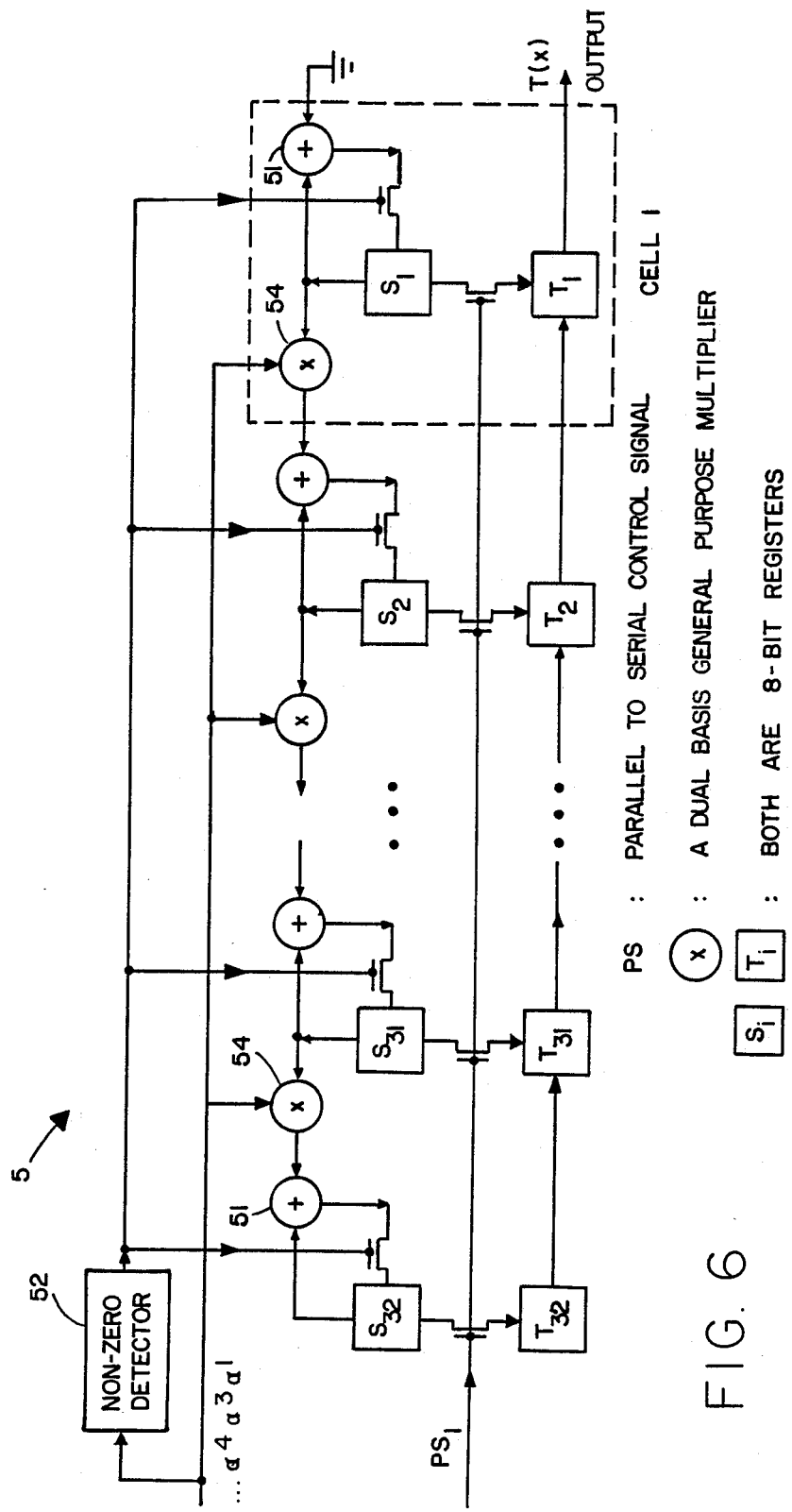
FIG. 6 is a block diagram of the polynomial expansion in FIGS. 1A and 1B.

FIG. 6 shows a block diagram of the polynomial expansion circuit 5. The Forney syndromes for either the time domain decoder or the transform decoder are calculated in this unit. It is organized very much like the power expansion unit 3 shown in FIG. 5, except that each 8-bit register $S_i$ of lower order is added through adder 51 to the 8-bit register $S_{i+1}$ after multiplication by a multiplier 54 in response to the output $\alpha^{ki}$ when a nonzero $\alpha^{ki}$ is detected. A central parallel to serial control signal ($PS_1$) causes the content of the register $S_i$ to be transferred to a register $T_i$ when I has reached 32. The register $T_i$ is also an 8-bit register and is used for synchronized serial output of $T(x)$ to the modified GCD 8.

Figure 7A:
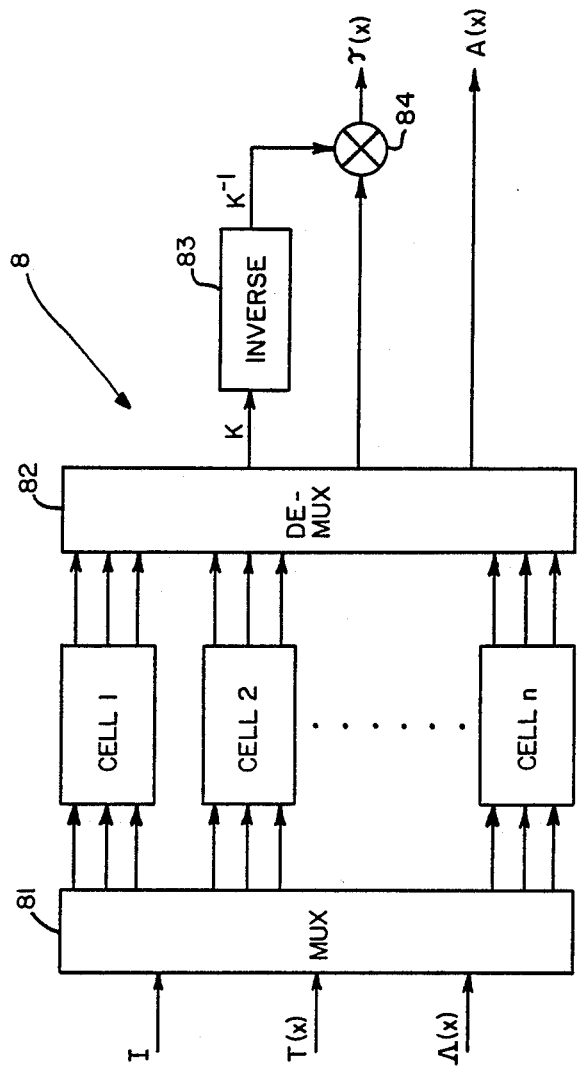
FIG. 7A is a block diagram of the modified GCD in FIGS. 1A and 1B.
Figure 7B:
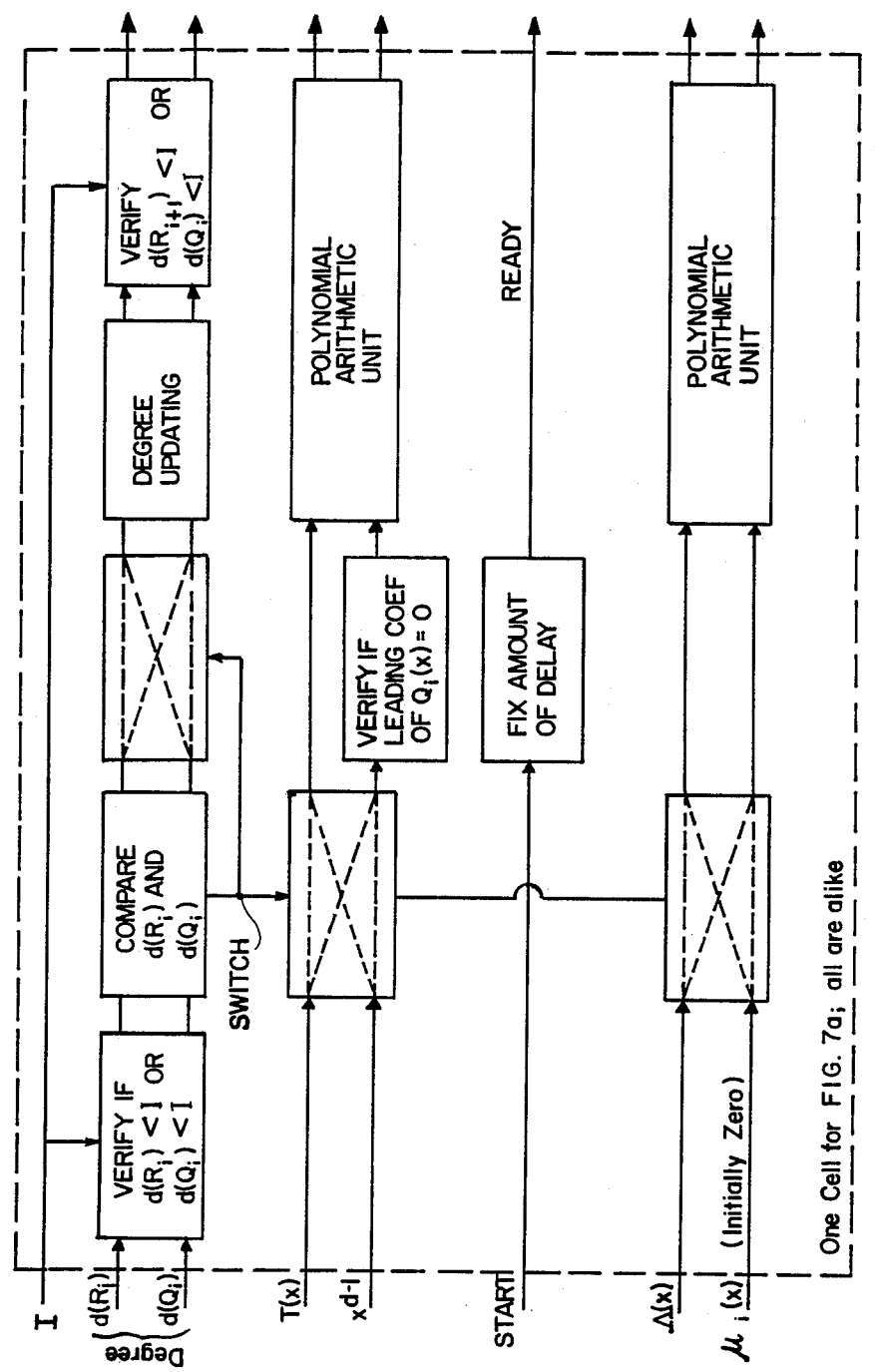
FIG. 7B illustrates the implementation of a cell in the modified GCD in FIG. 7A.

FIG. 7A depicts the block diagram of the modified GCD unit 8, and FIG. 7B depicts the architecture of one cell in FIG. 7A. As described previously by H. M. Shao, T. K. Truong, I. S. Hsu, L. J. Deutsch and I. S. Reed in "A single chip VLSI Reed-Solomon decoder," presented at the International Conference on Acoustics, Speech and Signal Processing, ICASSP, Tokyo, Japan, Apr. 7-11, 1986, a multiplexing scheme can be applied to the modified GCD unit to reduce the number of cells needed. Normally the number of cells needed in this example is 32 (the maximum number of erratas that can be corrected), and they are normally connected in cascade. By using a smaller number of cells (n=5), it is possible to multiplex and then demultiplex data into and out of the cells. By the time the fifth has been reached by the multiplexer, the first cell has completed the GCD computation, and the demultiplexer has read out $\tau(x)$ and $A(x)$, or just $\tau(x)$, so the multiplexer may again address the first cell. In that way, the 5 cells are time shared for 32 GCD computations.

The inputs $d(R_i)$ and $d(Q_i)$ are degree inputs compared with I to determine if $d(R_i) \leq I$ or $d(Q_i) \leq I$. If either is greater than I, stop operation. Next compare $d(R_i)$ and $d(Q_i)$. If $d(Q_i)$ is greater than $d(R_i)$, all paired inputs are switched as indicated schematically, otherwise paired inputs are passed on in the same channels as presented at the input terminals. Next there is a function of degree updating by subtracting one (1) from the greater of the degree inputs. The last function in the degree channel is to verify that $d(R_{i+1}) \leq I$ or $d(Q_i) \leq I$. If either is true, stop and output the data, and if not, increment $\mu_i(x)$ and allow recursion operation for another cycle. That is repeated until the condition is satisfied. A synchronized "start" signal is delayed by a fixed amount which is the largest time expected for the cell to perform its recursive function. The output of the delay signal indicates to the demultiplexer that it is ready to have its outputs from the polynomial arithmetic units read out, as shown schematically in FIG. 7B. This architecture for a single cell of this architecture is disclosed for a series connected set of 32 cells in a paper by Howard M. Shao, T. K. Truong, Leslie J. Deutsch, Joseph H. Yuen and Irving S. Reed, "A VLSI Design of a Pipeline Reed-Solomon Decoder," *IEEE Transactions on Computers*, Vol. C-34, No. 5, May 1985. Here fewer cells are being used on a time-sharing basis.

The polynomial $\Lambda(x)$ together with the Forney syndrome polynomial $T(x)$ are two of the three inputs to the modified GCD unit. The stop indicator for the Euclidean algorithm capability of the code is computed by block 6 which provides the third input $I = \lfloor (d+v-3)/2 \rfloor$. The output of the modified GCD unit is the errata locator polynomial $\tau(x)$ and the errata evaluator polynomial $A(x)$. In operation of the GCD unit 8, a multiplexer 81 receives all of the three inputs and distributes them to cells 1, 2 ... n, each of which is a complete modified GCD unit. A demultiplexer 82 connects the outputs $A(x), \tau(x)$ and k of the cells in a corresponding order. One further step is necessary for each $\tau(x)$ output, which is to normalize $\tau(x)$ polynomials by multiplying by the inverse of K obtained through an inverser 83. A multiplexer 84 is provided for that function of normalizing.

Figure 8:
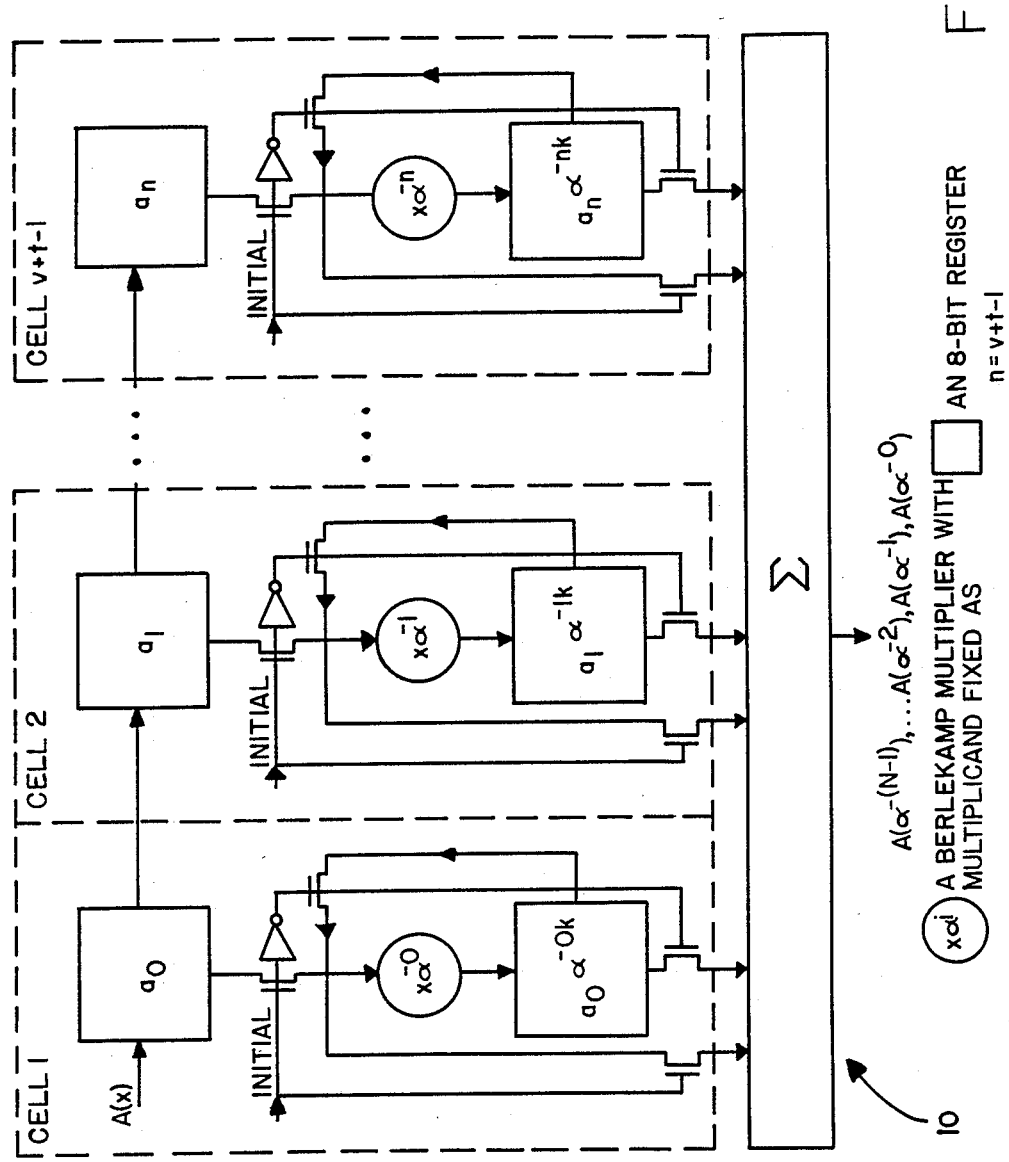
FIG. 8 is a block diagram of the polynomial evaluation unit in FIG. 1A.

The differing functional units of the time and transform domain decoders are shown in the second parts of FIGS. 1A and 1B labelled as II. One output of the modified GCD unit of the time domain decoder, the errata locator polynomial $\tau(x)$, is fed to a Chien search unit 9a which finds the root $\tau(x)$ and to another unit 9b for computing $[x^{b-1}\tau'(x)]^{-1} = [x^{111}\tau'(x)]^{-1}$, where b=112 in this design. The other output of the modified GCD unit of the time domain decoder, the errata evaluator polynomial $A(x)$, is fed to the polynomial evaluation unit 10 to perform the evaluation of $A(x)$. FIG. 8 shows the block diagram of the polynomial evaluation unit 10. Each square block is an 8-bit register, and each circle is a Berlekamp multiplier with a fixed multiplicand $\alpha^i$. The input registers are $A_0, A_1 \ldots A_n$, where n=v+t−1 and the output registers being summed are $A_0\alpha^{-0k}$, $A_1\alpha^{-1k} \ldots A_n\alpha^{-nk}$, where the $\alpha$'s are precomputed and fixed. The summer provides the polynomial $A(x) = A(\alpha^{-(N-1)}), \ldots A(\alpha^{-2}), A(\alpha^{-1}), A(\alpha^{-0})$.

Figure 9:
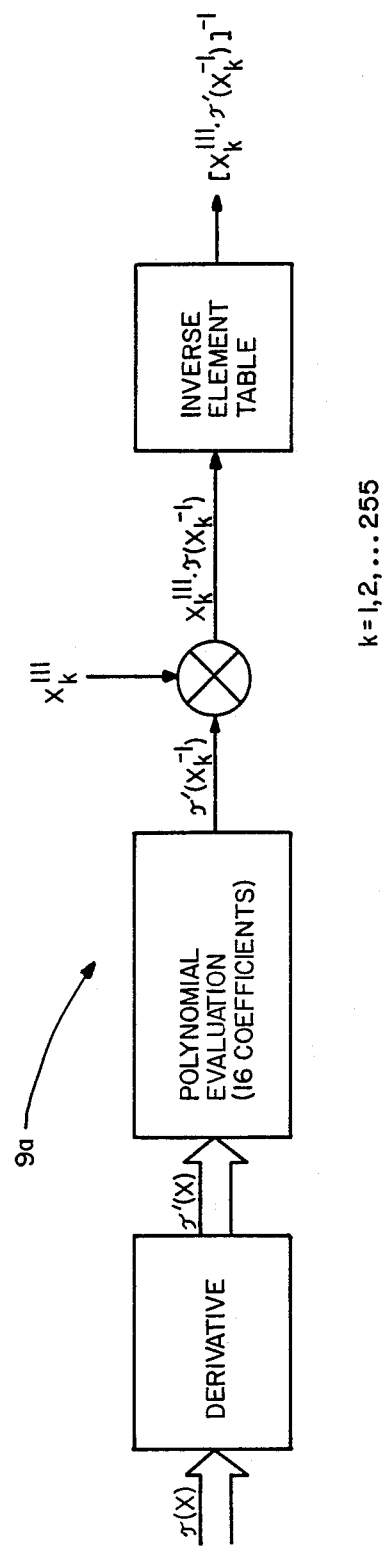
FIG. 9 is a block diagram of the $[x^{111}\tau'(x)]^{-1}$ computation unit in FIG. 1A.

The $[x^{111}\tau'(x)]^{-1}$ unit 9a performs the calculation of one part of the errata magnitude. See H. M. Shao, T. K. Truong, I. S. Hsu, L. J. Deutsch and I. S. Reed, "A single chip VLSI Reed-Solomon decoder," presented at *International Conference on Acoustics, Speech and Signal Processing, ICASSP,* Tokyo, Japan, Apr. 7-11, 1986. FIG. 9 shows the block diagram of this unit, where k=1, 2, . . . 255. Its implementation is straightforward with the use of an inverse element table. The product of the outputs of the polynomial evaluation unit and the $[x^{111}\tau'(x)]^{-1}$ unit forms the errata magnitude.

In the time domain decoder, the Chien search unit 9b is used to search for the error and erasure locations, as described in the paper just cited above. The implementation of the Chien search unit is not shown because the Chien search is so well known. Basically it determines the roots of $\tau(x)$. The preferred architecture of the Chien search unit is similar to that of the polynomial evaluation unit, except there is a zero detector at the end.

Figure 10:
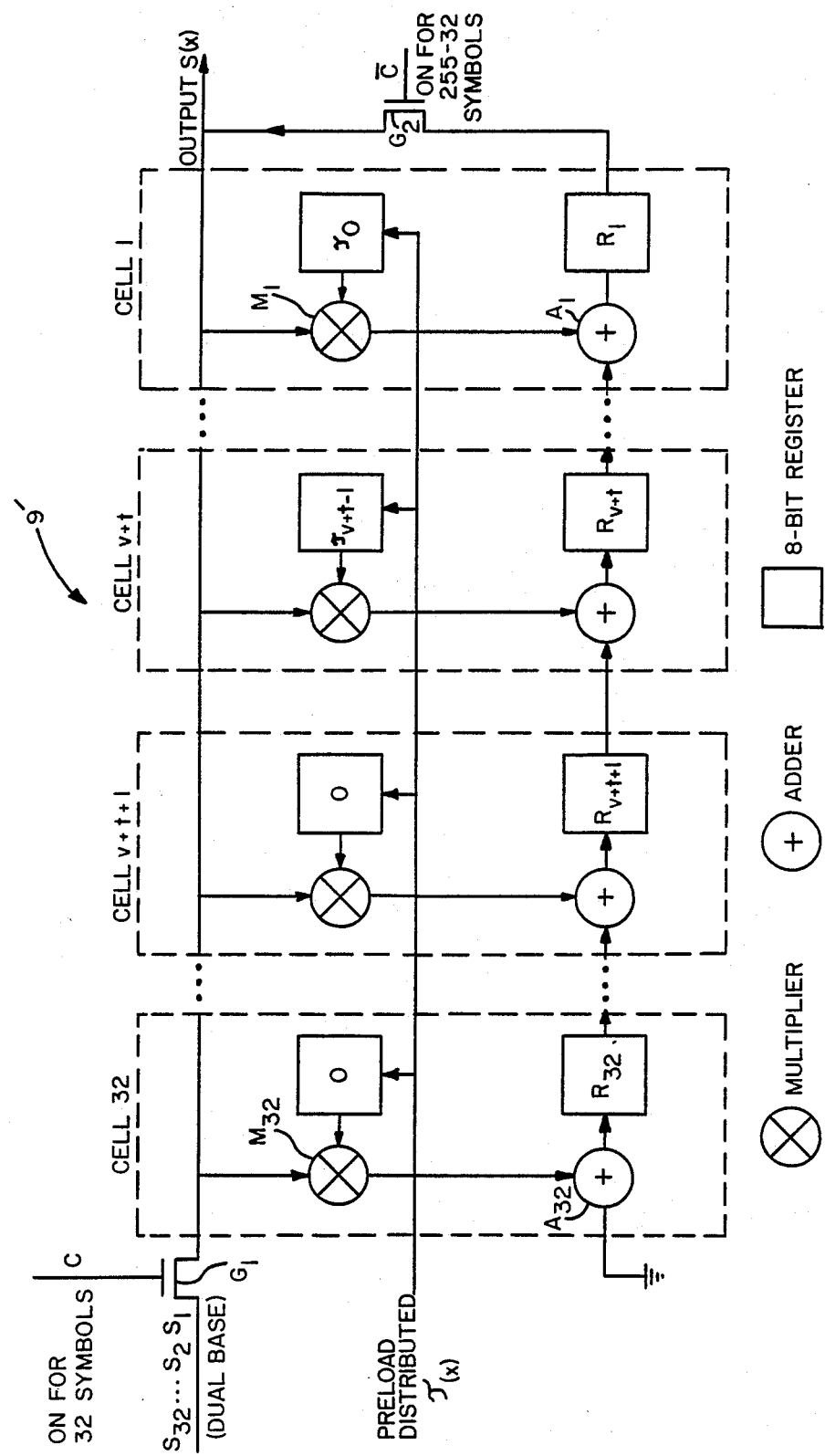
FIG. 10 is a block diagram of the transform error pattern computation unit in FIG. 1B.

For the transform domain decoder design, the output from the modified GCD unit is the errata locator polynomial $\tau(x)$. This output is fed to the transform error pattern unit 9', along with the syndromes $S(x)$ from the syndrome computation unit 1, to calculate the extended syndromes. Operation of the new architecture for the transform error pattern unit 9' is described below. The realization of this idea is shown in the block diagram of the transform of the error-pattern unit, given in FIG. 10.

Referring to the block diagram of the transform of the error pattern, a gate $G_1$ is opened by a control signal C, and a gate $G_2$ is held off by the complement $\bar{C}$ of the control signal. But first a set of 8-bit latches $L_1$ through $L_{32}$ in cells 1 through 32 are loaded with the coefficients of $\tau(x)$ in sequence with the first $L_1$ receiving the first coefficient $\tau_0$, the next receiving the next coefficient, until cell v+t receives the last coefficient $\tau_{v+t-1}$. The rest of the flip-flops store a zero. Thus, $\tau_{v+t}$ represents the largest number n of errors in the error locator polynomial $\tau(x)$. The output $S(x)$ from the syndrome computation unit 1 is passed through cells 1 through 32 for multiplication by the coefficients in sequence by the separate multipliers $M_1$ through $M_{32}$. The products are added through adders $A_1$ through $A_{32}$, and the sums are stored in 8-bit registers $R_1$ through $R_{32}$. After 32 symbol periods, $R_1$ through $R_{32}$ each stores a sum of products, and gate $G_2$ is turned on for 255-32 symbol periods so that the output of register $R_1$ is recirculated to the output terminal $S'(x)$ to all of the multipliers $M_1$ through $M_{32}$. In that way, the registers $R_1$ through $R_{32}$ are read out recursively and also fed back to each cell as inputs to reiterate the operation for an additional 255-32 cycles after the first 32 symbols pass to the output $S'(x)$ in sequence.

Figure 11:
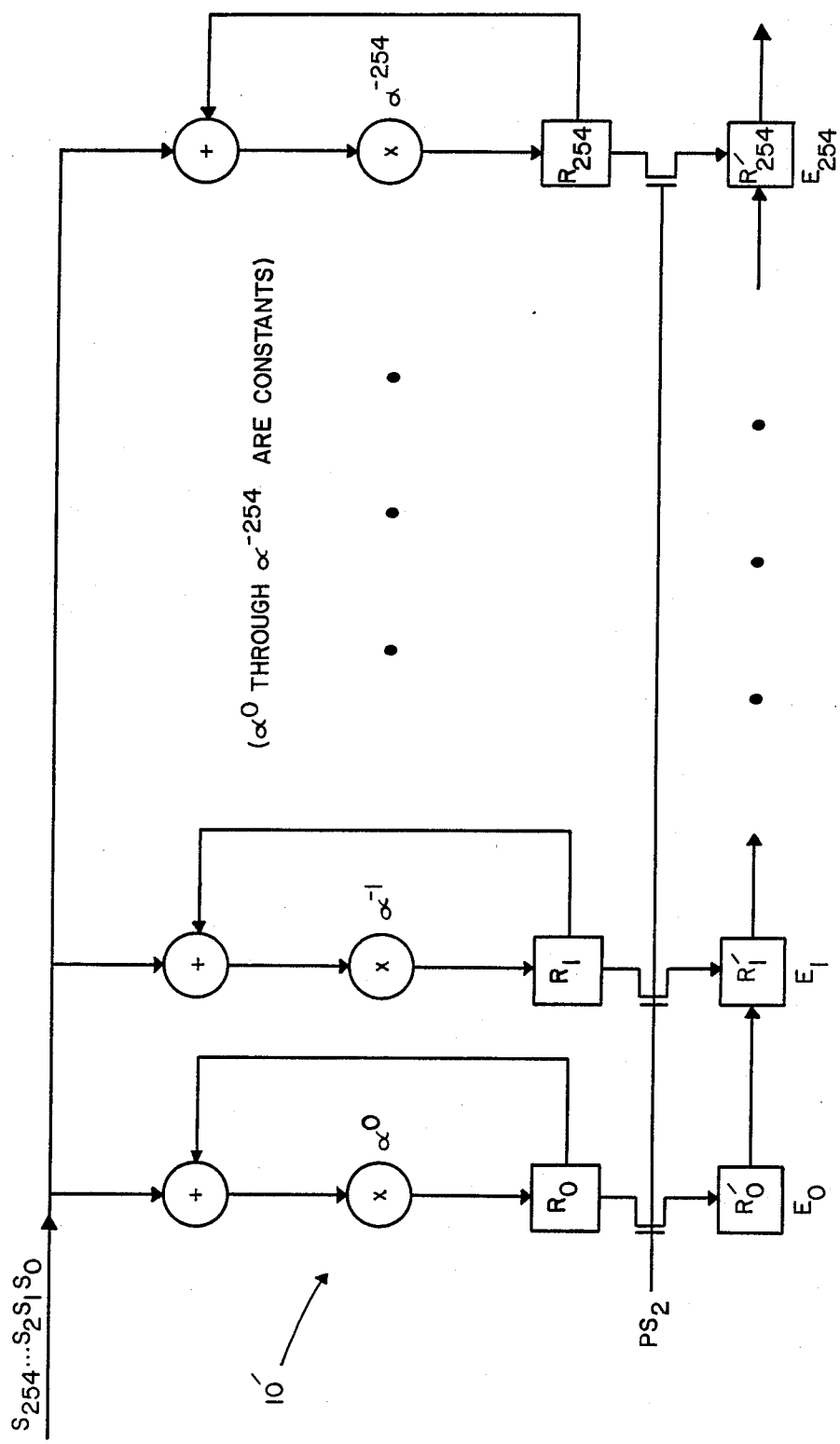
FIG. 11 is a block diagram of the inverse transform unit in FIG. 1B.

The transform error pattern $S'(x)$ produced by the computation of extended syndromes $\tau(x)$, together with the original syndromes $S(x)$, is sent to the inverse transform unit 10' to obtain the estimated errata patterns. FIG. 11 shows the block diagram of the inverse transform. It is easy to see that the architecture for the inverse transform is similar to that of the syndrome computation unit except that 255 cells are needed in the inverse transform unit while the syndrome computation unit needs only 32 subcells, and a parallel to serial register ($R_0'$, $R_1'$ . . . $R'_{254}$) is used. $\alpha^{-n}$ for each multiplier is constant and prestored for the inverse transform operation.

Clearly, the architecture of the transform domain decoder design is simpler than that of the time domain decoder design. This is because the transform domain decoder design needs only two regular function blocks and an adder 11' in part II, whereas the time domain decoder requires three function blocks plus a multiplier 9c, and AND gate 9d and an adder 11 to produce a decoded output.

Furthermore, the inverse-transform unit 10' in the transform domain design contains 255 similar cells in the (255,223) RS decoder. It is estimated that these 255 cells occupy only a moderate amount of silicon area, and that their geometric arrangement can be regular and simple. Therefore, time needed for design and test of such a VLSI chip can be saved substantially. However, this advantage of the transform domain decoder is valid only for moderately short length RS codes. If long length RS codes are used to enhance the system's performance, the transform domain decoder nees a large inverse transform block. This might cause a problenm in the VLSI implementation. In general, if a $GF(2^m)$ field is used to define an RS code, an inverse transform block composed of $2^m-1$ cells is needed. Hence, the number of cells needed in an inverse transform block increases exponentially with the integer m. The number of transistors needed in the time domain decoder goes up only linearly as the integer m increases. Therefore, for long length codes, the time domain decoder is the more appealing approach. Although the computation complexity of the time domain decoder is more complex than that of the transform domain decoder, for long RS codes, the number of transistors needed in a time domain decoder is substantially less than that in a transform domain decoder.

EXAMPLE OF THE INVERSE TRANSFORM OPERATION

Figure 12:
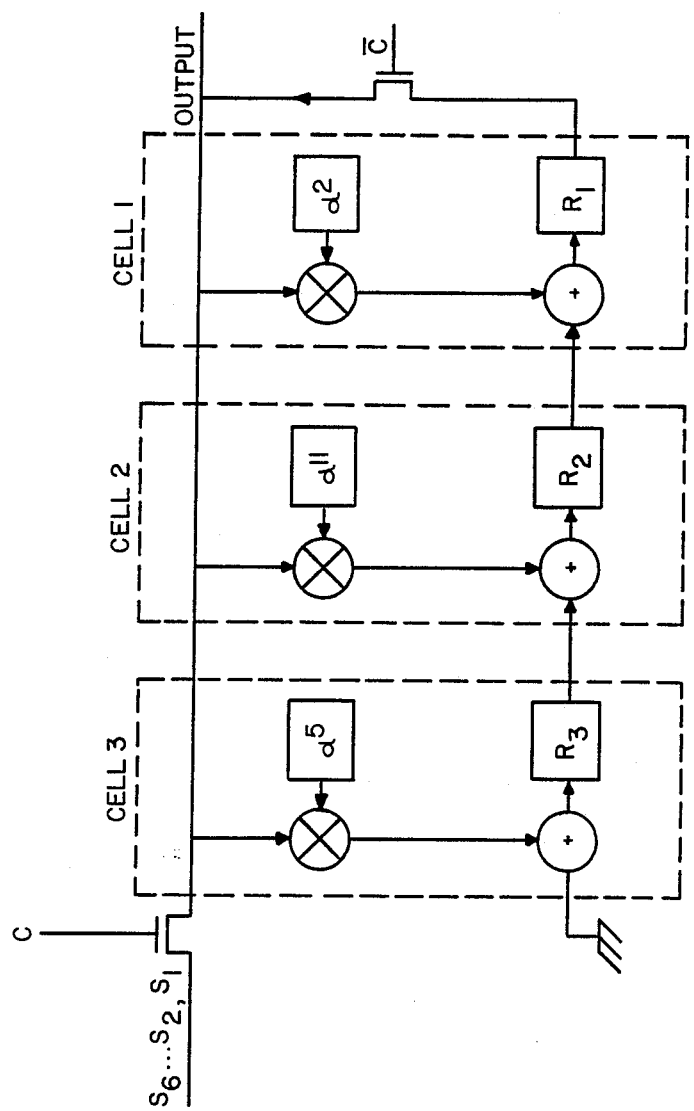
FIG. 12 is a diagram for the systolic array for computing the transform error pattern in FIG. 1B.

In this example, a three-cell VLSI architecture is shown in FIG. 12 to compute the transform of the error pattern. Recently, Johnson et al., "Towards a formal treatment of VLSI arrays," Caltech Conference on VLSI, January 1981 proposed a systolic array for computing a linear convolution. Using a technique similar to that suggested by Johnson et al., the transform of the error pattern in Eq. (23) or (24) can be converted to a recursive convolution formula and implemented in a systolic array. The advantage of this method over the previous method in H. M. Shao, T. K. Truong, L. J. Deutsch, H. H. Yuen and I. S. Reed, "A VLSI Design of a Pipeline Reed-Solomon Decoder," *IEEE Trans. on Computers,* vol. C-34, no. 5, May 1985, is that the long delay needed in the large XOR tree used for summing all the terms in Eq. (23) is eliminated. Also the zero detectors needed in the previous design are not required in this new architecture.

To illustrate the operation of this three-cell architecture shown in FIG. 12, the data in Example 2 for a (15,9) RS code are used as an example. The recursive equation to compute the remainder of the transform of the error pattern is given in Eq. (25). Operation of the architecture for computing Eq. (25) is shown in FIG. 12 with reference to just three cells and Table B. In this figure, the function of each cell can be described by a register transfer relation of the type $R_i \leftarrow R_{i+1} + S_k \alpha^i$. The input data $S_i$ are sent to all the cells simultaneously and the output is taken from the register sequentially.

To understand the operation of this circuit, assume initially that all registers $R_i$ for $1 \leq i \leq 3$ are set to zero.

The control signal C is high for 6 symbol clocks to allow data $S_1, S_2, \ldots, S_6$ to be fed into the circuit. The input data are also sent to the output node. At the same time, the complement signal $\overline{C}$ of the signal C is low to prevent the data stored in register $R_1$ from being sent to the output node. Note that one "clock time" for one Galois field symbol equals 4 circuit clock times. At the 7th symbol clock time the control signal C is switched to low or zero so that $\overline{C}=1$. Therefore, the data stored in register $R_1$, which equals $S_7$ at that moment, is sent to both the output node and fed back to all basic cells. This process continues until the rest of the transform of the error pattern, i.e., $S_7, S_8, \ldots, S_{15}$ are obtained. The detailed operation of this circuit is illustrated in Table 2 below:

TABLE 2

The Fifteen Steps of the Transform of the Error Pattern Algorithm

| Symbol Clock | $R_1$ | $R_2$ | $R_3$ |
|---|---|---|---|
| 1 | $\alpha^5 S_1$ | $\alpha^{11} S_1$ | $\alpha^2 S_1$ |
| 2 | $\alpha^5 S_2$ | $\alpha^5 S_1 + \alpha^{11} S_2$ | $\alpha^{11} S_1 + \alpha^2 S_2$ |
| 3 | $\alpha^5 S_3$ | $\alpha^5 S_2 + \alpha^{11} S_3$ | $\alpha^2 S_3 + \alpha^{11} S_2 + \alpha^5 S_1 = S_4$ |
| 4 | $\alpha^5 S_4$ | $\alpha^{11} S_4 + \alpha^5 S_3$ | $\alpha^2 S_4 + \alpha^{11} S_3 + \alpha^5 S_2 + S_5$ |
| . | | | |
| . | | | |
| 15 | $\alpha^5 S_{14}$ | $\alpha^{11} S_{14} + \alpha^5 S_{13}$ | $\alpha^2 S_{14} + \alpha^{11} S_{13} + \alpha^5 S_{12} = S_{15} = S_0$ |

Although particular embodiments of the invention have been described and illustrated herein, it is recognized that modifications and variations may readily occur those skilled in the art. Consequently, it is intended that the claims be interpreted to cover such modifications and variations.

What is claimed is:

1. A method for time or transform domain decoding of RS coded received messages which corrects both errors and erasures in decoding of RS coded messages by the use of the Euclidean algorithm without separate computations of the errata locator polynomial $\tau(x)$ and the errata evaluator polynomial A(x) comprising the steps of
   (a) computing the transform of the received m-bit vector over the Galois Field GF($2^m$) from Eq. (2) for the initial syndrome computation, then calculate the erasure locator polynomial $\Lambda(x)$ and defined deg $\{\lambda(x)\}=v$,
   (b) computing the Forney syndrome polynomial T(x) from Eq. (7),
   (c) applying the Euclidean algorithm to $x^{d-1}$ and T(x) as given by Eq. (7) to determine the errata locator polynomial $\tau(x)$ and errata evaluator polynomial A(x), using as initial values of the Euclidean algorithm $\tau_0(x)=\Lambda(x)$, $\tau_{-1}(x)=0$, $R_{-1}(x)=x^{d-1}$ and $R_0(x)=T(x)$, wherein the recursion in Eq. (9) for $R_s(x)$ and $\tau_s(x)$ terminates when deg $\{R_s(x)\} \leq \lfloor(d+v-3)/2\rfloor$ for the first time for some value $s=s'$, and then compute $\tau(x)$ and A(x) from Eqs. (10a), and (10b), and
   (d) for time domain decoding, computing the error and erasure locations by finding the roots of the errata location polynomial $\tau(x)$ by Eq. (4c), or for transform domain decoding, determining the error and erasure locations by subjecting the errata locations polynomial $\tau(x)$ and the syndrome S(x) from the syndrome computaton in step (a) to a transform error pattern calculation which produces extended syndromes and inverting the sequence of the error pattern thus determined.

2. A method as defined by claim 1 wherein step (c), for $v=d-1$, $\tau(x)$ is set equal to A(x) and A(x) is set equal to T(x).

3. A method as defined by claim 1 or claim 2 for time domain decoding, where the last step (d) is comprised of
   (e) conducting polynomial evaluation of the errata evaluator polynomial A(x) and obtaining the values of polynomial $A(x)=A(\alpha^{-(N-1)})$, ..., $A(\alpha^{-2})$, $A(\alpha^{-1})$, $A(\alpha^{-0})$,
   (f) computing from the errata locator polynomial $\tau(x)$ the value $(x^{b-1}\tau'(x))^{-1}$, where b is a constant chosen for the design of the decoder for a specific RS code,
   (g) determining from the errata locator polynomial $\tau(x)$ the roots using a Chien search,
   (h) multiplying the result of step (e) with the result of step (f),
   (i) performing a logical AND between the polynomial results of step (h), and
   (j) adding the received message to the results of step (i) to produce a decoded output of the RS coded received message with errors and erasures corrected.

4. A method as defined by claim 1 or claim 2 for transform domain decoding, where the last step (d) is comprised of
   (e) calculating from the errata locator polynomial $\tau(x)$ and the syndromes from step (a), an extended syndrome S'(x) which constitutes a transform of the error pattern,
   (f) from the extended syndrome S'(x) produced in step (e) produce an inverse transform $e_j$'s, and
   (g) adding the received message to the inverse transform $e_j$'s of the transform error pattern to produce a decoded output.

5. Apparatus for time domain decoding of received RS coded messages, which apparatus corrects both errors and erasures in decoding of RS codes comprised of syndrome means for initial syndrome computation of RS coded received messages for producing an extended syndrome s(x),
   means for erasure locator power calculation of erasure location data received with RS coded received messages,
   means responsive to said syndrome s(x) of the initial received message for polynomial expansion of said initial syndrome to produce a Forney syndrome polynomial T(x),
   means for expansion of said erasure location power calculation to produce an erasure locator polynomial $\Lambda(x)$,
   means for counting the number v of input erasures from said received RS coded messages,
   means responsive to said counting means for generating the $\lfloor d+v-3/2 \rfloor$ to produce a signal I, where d is a fixed number chosen for the designated RS code, and v is the number of erasure locations counted,
   means responsive to the signals T(x), $\Lambda(x)$ and I to produce an errata location polynomial $\tau(x)$ and errata evaluator polynomial A(x),
   polynomial evaluation means responsive to the errata evaluator polynomial A(x) for evaluation of said polynomial A(x) by producing the following values $A(\alpha^{-(N-1)}), \ldots A(\alpha^{-2}), A(\alpha^{-1}), A(\alpha^{-0})$, where the multiplication of $A(x)$ is in a Berlekamp multiplier with the multiplicand $\alpha^i$ fixed, where $\alpha$ is a primitive element in the Galois Field, value means responsive to said errata locator polynomial $\tau(x)$ for computing the value $(x^{b-1}\tau'(x))^{-1}$, where b is a constant chosen for a specific RS code, means for determining the roots of the errata locator polynomial $\tau(x)$ in order to determine the locations of errors and erasures, multiplication means responsive to said polynomial evaluation means and value means for forming resultant magnitudes, means for forming the logical AND of the result of said magnitude with said locations of errors and erasures, and means for adding said logical AND results to the original message received at said syndrome computation means to form a decoded output constituting a restored message.

6. Apparatus for transform domain decoding of received RS coded messages, said coded messages having a $GF(2^m)$, where $N=2^m$ is the length of the (N,I) RS code over $GF(2^m)$ with a minimum distance, d, which apparatus corrects both errors and erasures in decoding of received RS coded messages comprised of syndrome means for initial syndrome computation of said RS coded received messages for producing an extended syndrome s(x), means for erasure locator power calculation of erasure location data received with said RS coded received messages, means responsive to said syndrome s(x) of the initial received message for polynomial expansion of said initial syndrome to produce a Forney syndrome polynomial T(x), means for expansion of said erasure location power calculation to produce an erasure locator polynomial $\Lambda(x)$, means for counting the number v of input erasures from said received RS coded messages, means for generating the $\lfloor d+v-3/2 \rfloor$ to produce a signal I, where d is a designed RS vector distance number chosen for the designated code, and v is the number of erasure locations counted, means responsive to the signals T(x), $\Lambda(x)$ and I to produce an errata locator polynomial $\tau(x)$ and errata evaluator polynomial A(x), means responsive to said errata locator polynomial $\tau(x)$ and said syndrome S(x) of the initial received message for producing extended transforms S'(x) of the errata pattern $\tau(x)$, means for inverting the transform S'(x) to recover the errata vector $e_j$'s, and combining the errata vector $e_j$'s with the RS encoded received message in an adder to produce a decoded output of the RS coded received message with errors and erasures corrected.

7. Apparatus as defined in claim 6 wherein said means for producing extended transforms S'(x) of the errata pattern is comprised of a first switch for introducing symbols $S_1$ through $S_n$ to n cells, where each cell comprises a register for storing one preloaded and distributed value of $\tau(x)$, a multiplier for multiplying each of said symbols $S_1$ to $S_n$ by said one preloaded and distributed value of $\tau(x)$ they are introduced by said first switch, an adder for adding the product of said multiplier and accumulated products of a preceding cell except that the first cell n, where the cells are numbered in descending order from n to 1, which adds zero to said product, and a register for storing the output of said adder.

* * * * *